US012164029B2

(12) United States Patent
Hirono

(10) Patent No.: US 12,164,029 B2
(45) Date of Patent: Dec. 10, 2024

(54) TIME MEASUREMENT DEVICE AND TIME MEASUREMENT APPARATUS

(71) Applicant: SONY SEMICONDUCTOR SOLUTIONS CORPORATION, Kanagawa (JP)

(72) Inventor: Daisuke Hirono, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 895 days.

(21) Appl. No.: 17/250,514

(22) PCT Filed: Jun. 12, 2019

(86) PCT No.: PCT/JP2019/023197
§ 371 (c)(1),
(2) Date: Jan. 31, 2021

(87) PCT Pub. No.: WO2020/031496
PCT Pub. Date: Feb. 13, 2020

(65) Prior Publication Data

US 2021/0293958 A1 Sep. 23, 2021

(30) Foreign Application Priority Data

Aug. 7, 2018 (JP) ................................ 2018-148675

(51) Int. Cl.

| | |
|---|---|
| ***G01S 17/10*** | (2020.01) |
| ***G01S 7/486*** | (2020.01) |
| ***G01S 7/497*** | (2006.01) |
| ***H01L 31/107*** | (2006.01) |

(52) U.S. Cl.
CPC ............. *G01S 17/10* (2013.01); *G01S 7/486* (2013.01); *G01S 7/497* (2013.01); *H01L 31/107* (2013.01)

(58) Field of Classification Search
CPC ....... H01L 31/107; G01S 7/497; G01S 7/486; G01S 7/4863; G01S 17/10
See application file for complete search history.

(56) References Cited

U.S. PATENT DOCUMENTS

| | | | |
|---|---|---|---|
| 2007/0182949 A1 | 8/2007 | Niclass | |
| 2008/0290259 A1 | 11/2008 | Mathewson et al. | |
| 2018/0059221 A1* | 3/2018 | Slobodyanyuk | G01S 7/4814 |

FOREIGN PATENT DOCUMENTS

| | | |
|---|---|---|
| CN | 101609153 A | 12/2009 |
| GB | 2426575 A | 11/2006 |
| JP | 09-200142 A | 7/1997 |
| JP | 2001-094403 A | 4/2001 |
| JP | 2008-542706 A | 11/2008 |
| WO | 2006/126026 A1 | 11/2006 |

* cited by examiner

*Primary Examiner* — Yaron Cohen
(74) *Attorney, Agent, or Firm* — CHIP LAW GROUP

(57) ABSTRACT

A time measurement device according to the present disclosure includes: a pixel that includes a light receiving element and a delay circuit having a variable delay time, is configured to output, as an output signal, a pulse signal that includes a received-light pulse having a pulse width corresponding to the delay time in a first operation mode, and is configured to have a ring oscillator with use of the delay circuit and configured to output, as the output signal, an oscillation signal in the ring oscillator in a second operation mode; and a time measurement section that is configured to perform time measurement processing on the basis of the output signal.

11 Claims, 18 Drawing Sheets

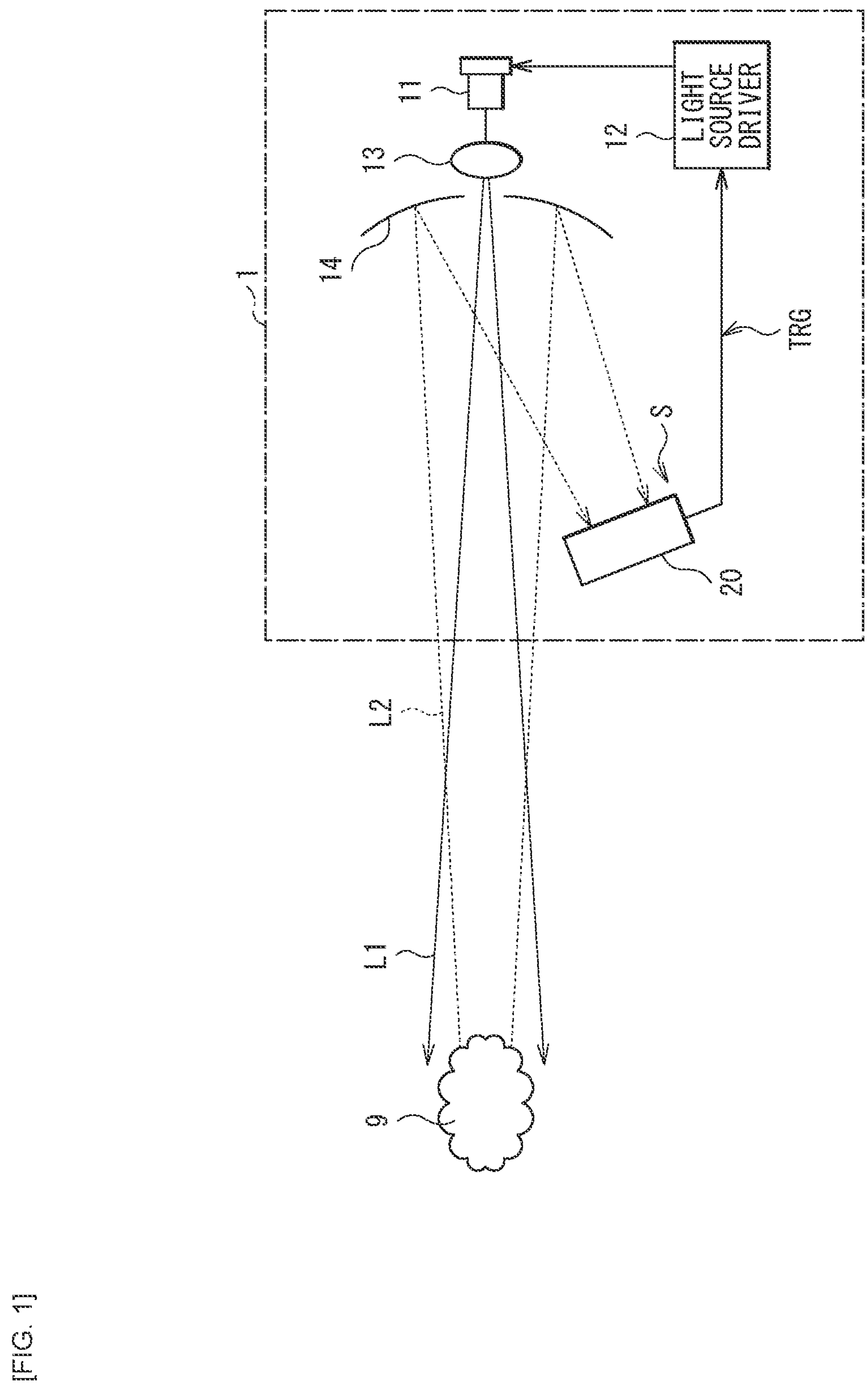
[FIG. 1]

[FIG. 2]
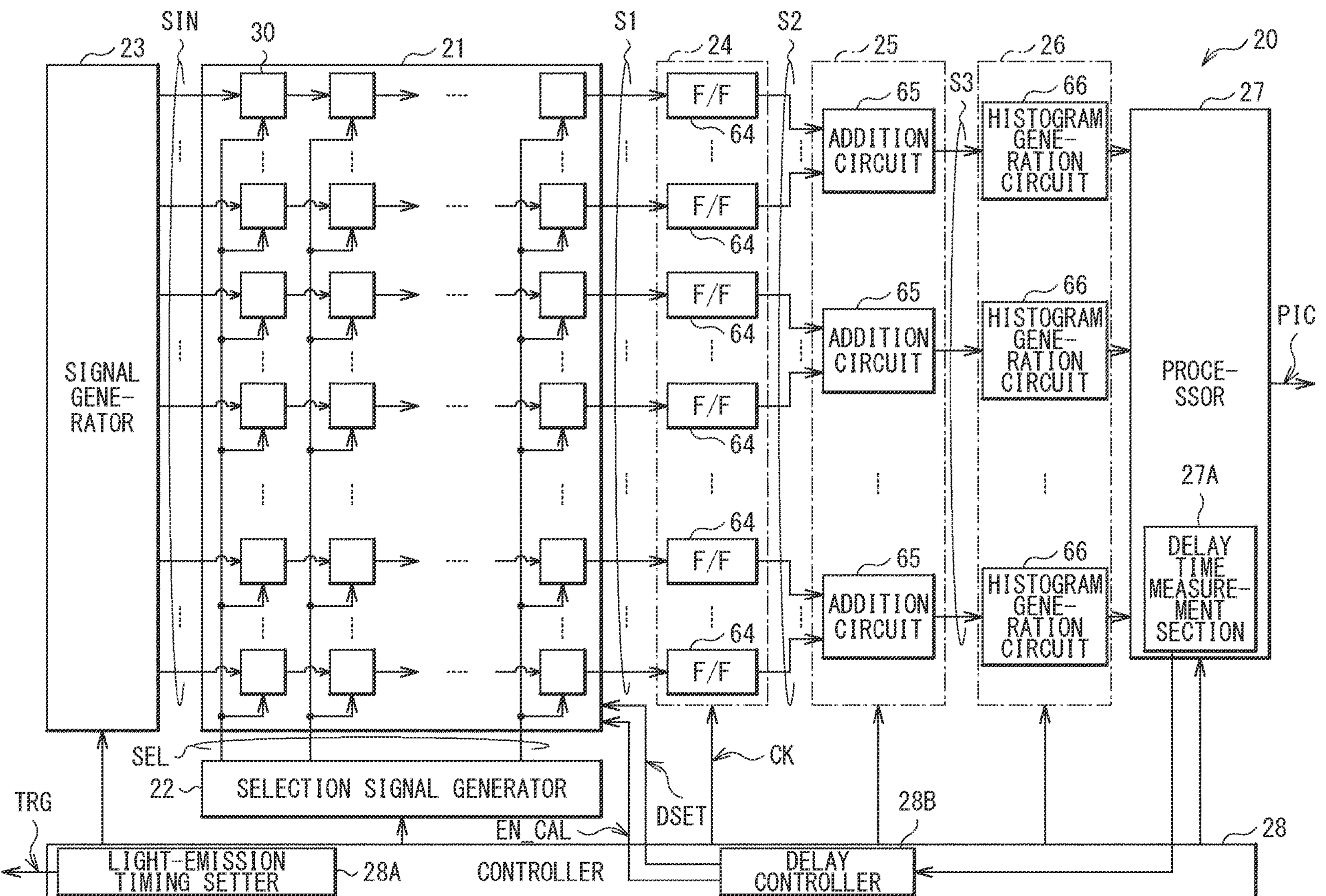

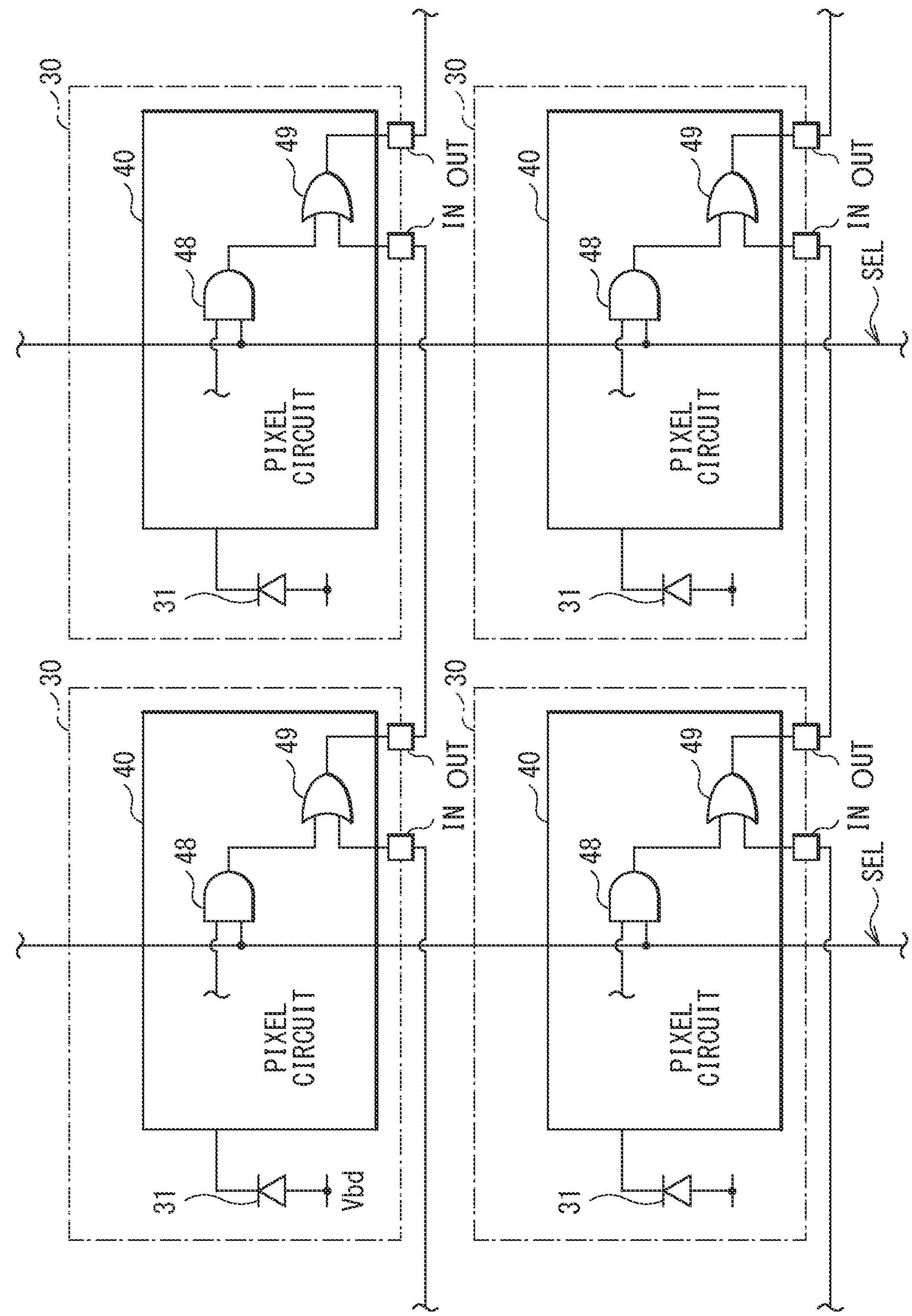
[FIG. 3]

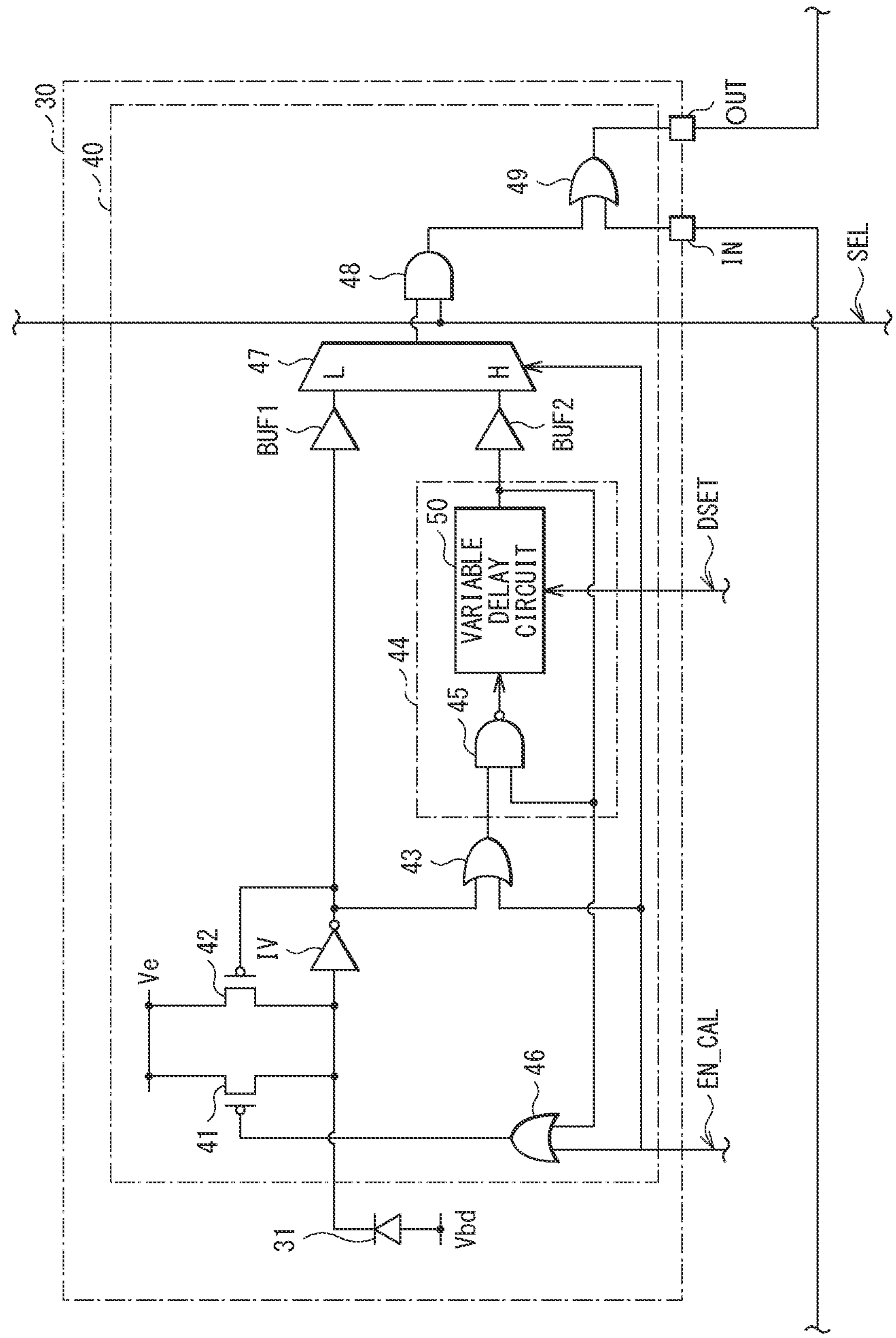
[FIG. 4]

[FIG. 5A]
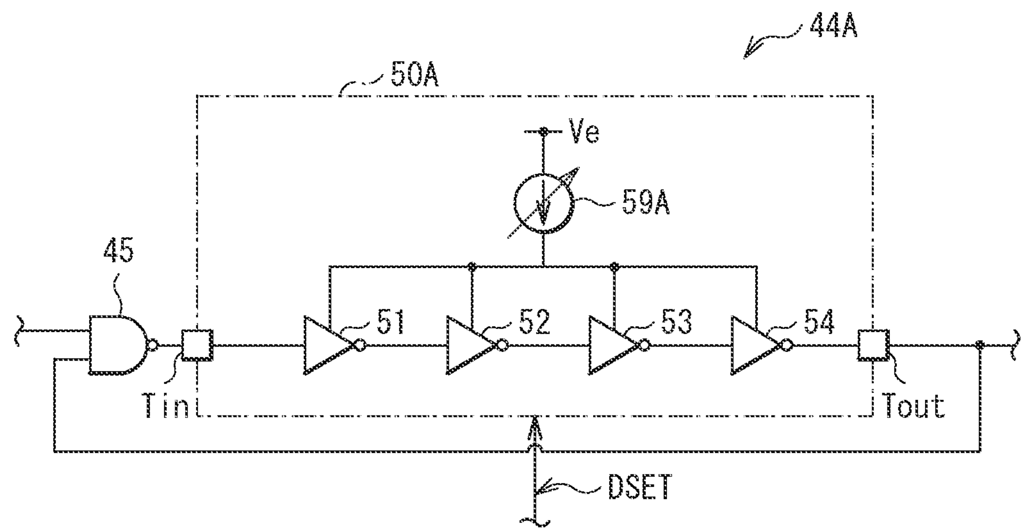
[FIG. 5B]
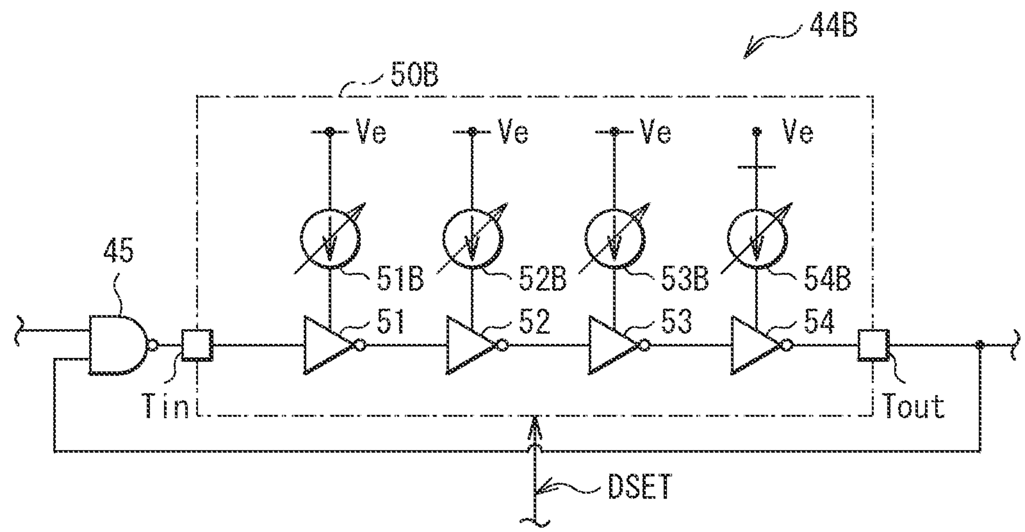
[FIG. 5C]
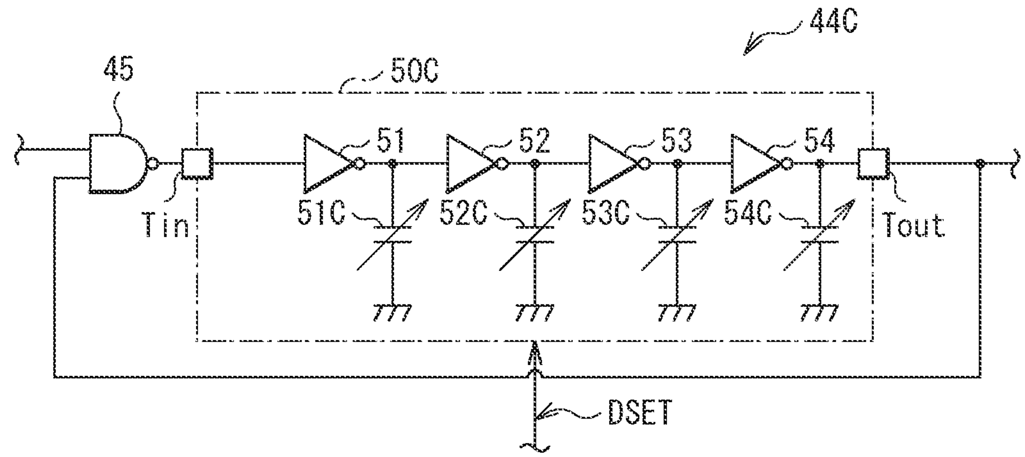

[FIG. 5D]
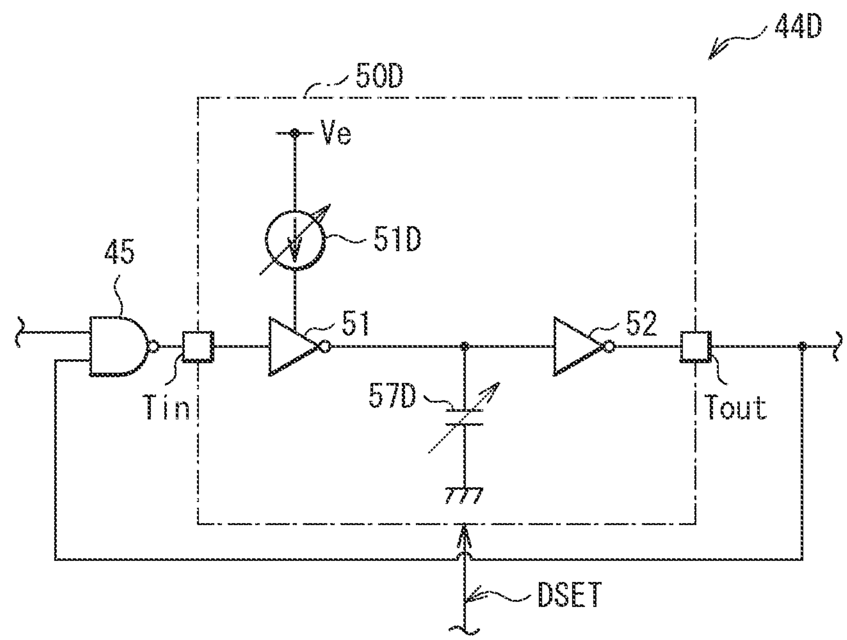
[FIG. 5E]
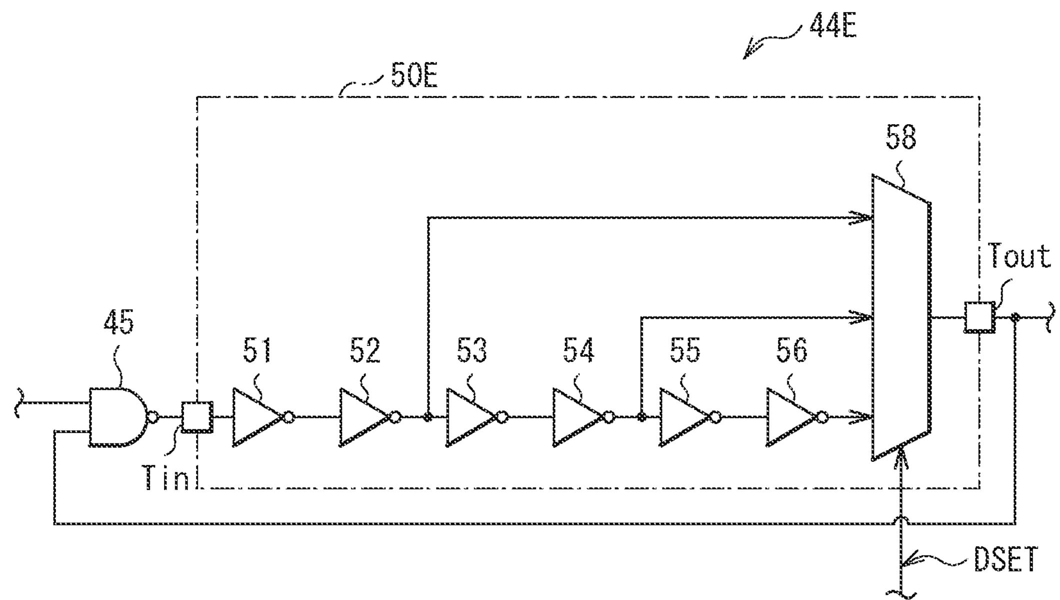

[FIG. 6]
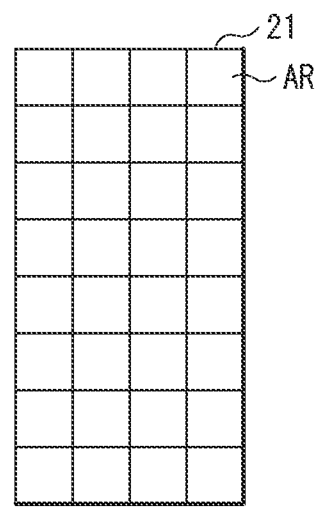
[FIG. 7]
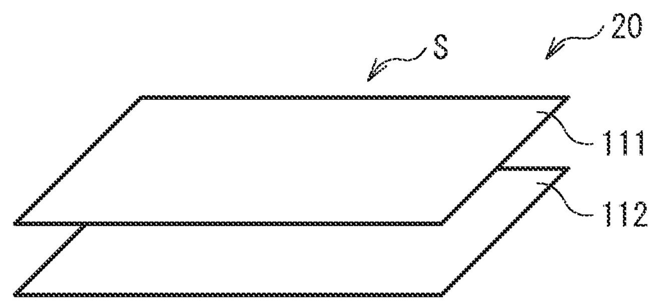

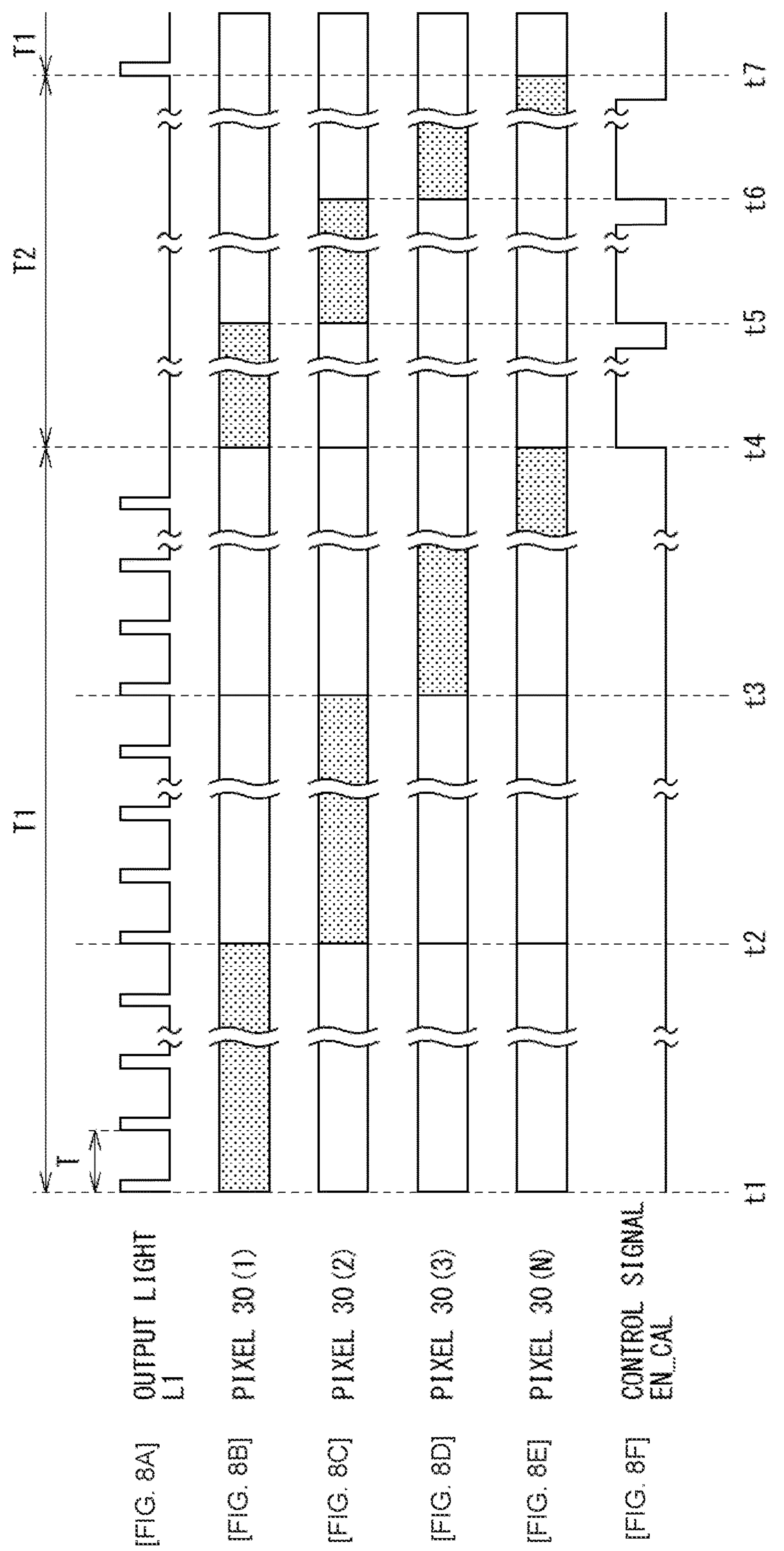
[FIG. 8A]
OUTPUT LIGHT L1
[FIG. 8B]
PIXEL 30 (1)
[FIG. 8C]
PIXEL 30 (2)
[FIG. 8D]
PIXEL 30 (3)
[FIG. 8E]
PIXEL 30 (N)
[FIG. 8F]
CONTROL SIGNAL EN_CAL
T
T1
T2
T1
t1
t2
t3
t4
t5
t6
t7

[FIG. 9]
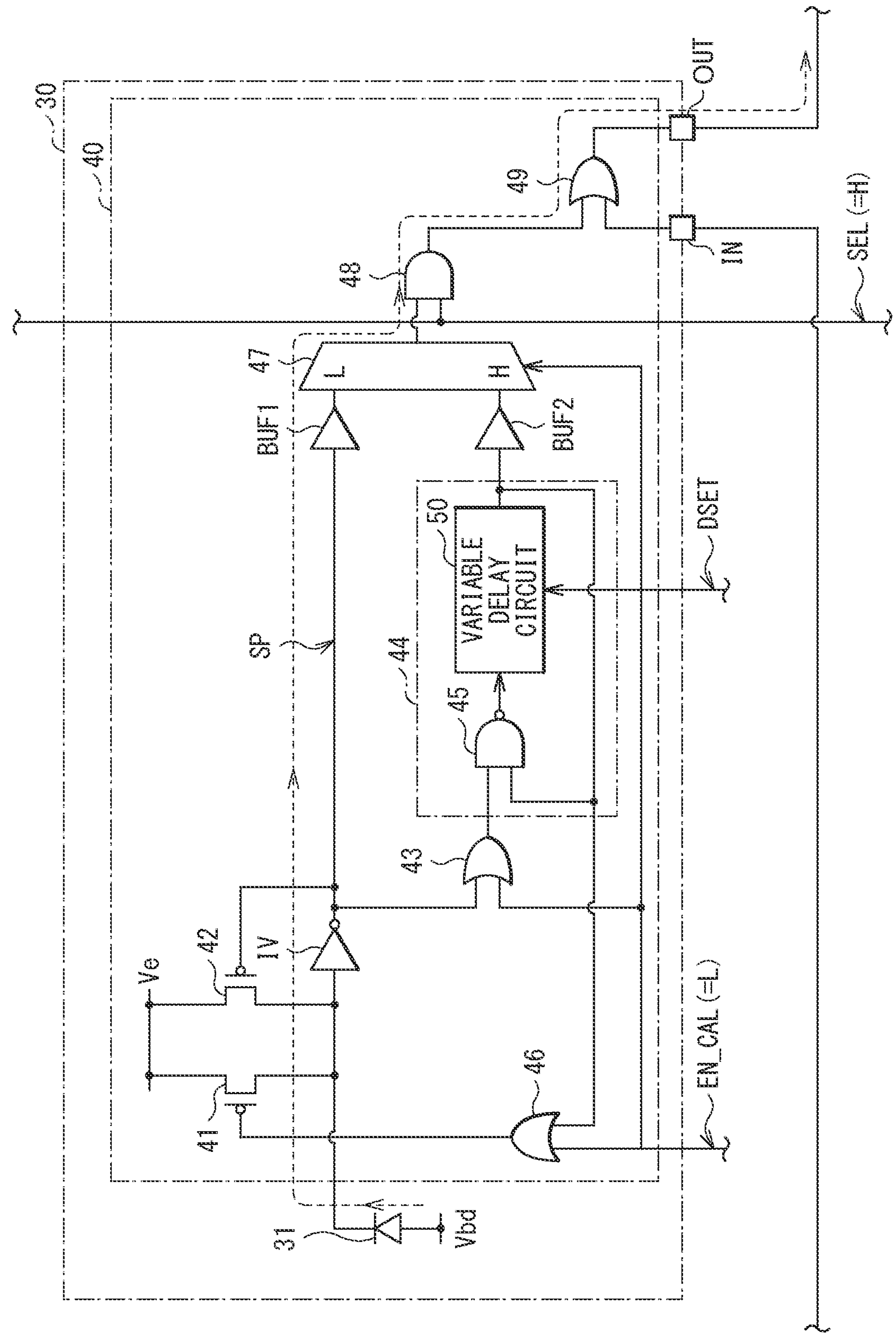

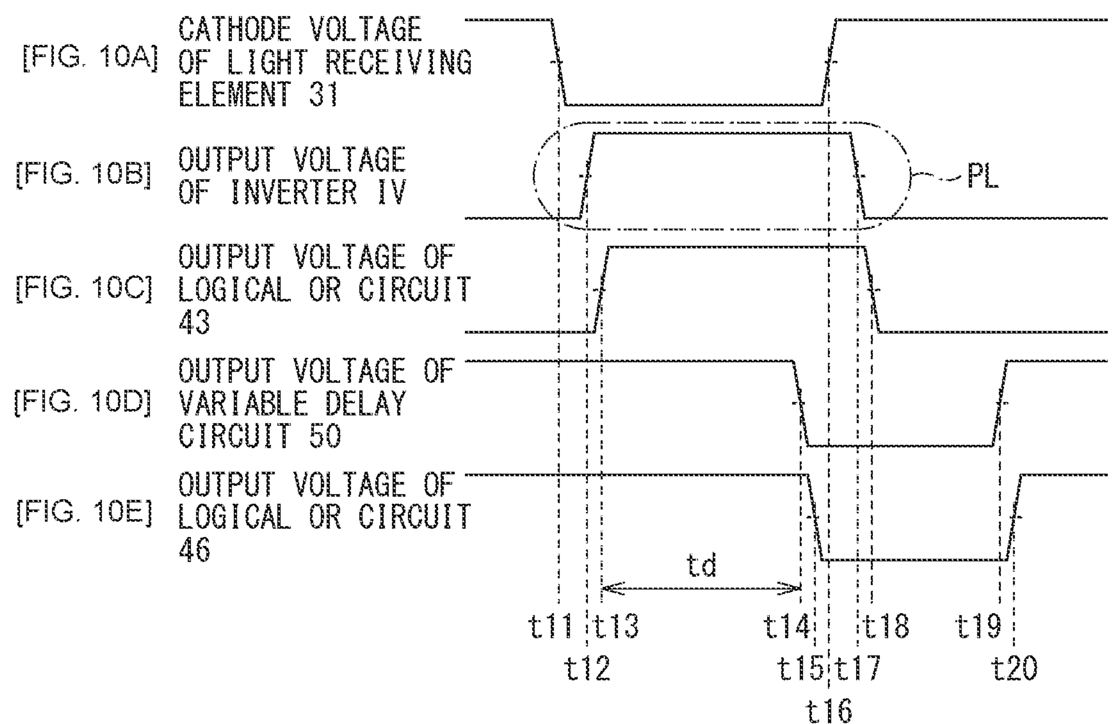
[FIG. 10A]
CATHODE VOLTAGE OF LIGHT RECEIVING ELEMENT 31
[FIG. 10B]
OUTPUT VOLTAGE OF INVERTER IV
PL
[FIG. 10C]
OUTPUT VOLTAGE OF LOGICAL OR CIRCUIT 43
[FIG. 10D]
OUTPUT VOLTAGE OF VARIABLE DELAY CIRCUIT 50
[FIG. 10E]
OUTPUT VOLTAGE OF LOGICAL OR CIRCUIT 46
td
t11
t12
t13
t14
t15
t16
t17
t18
t19
t20

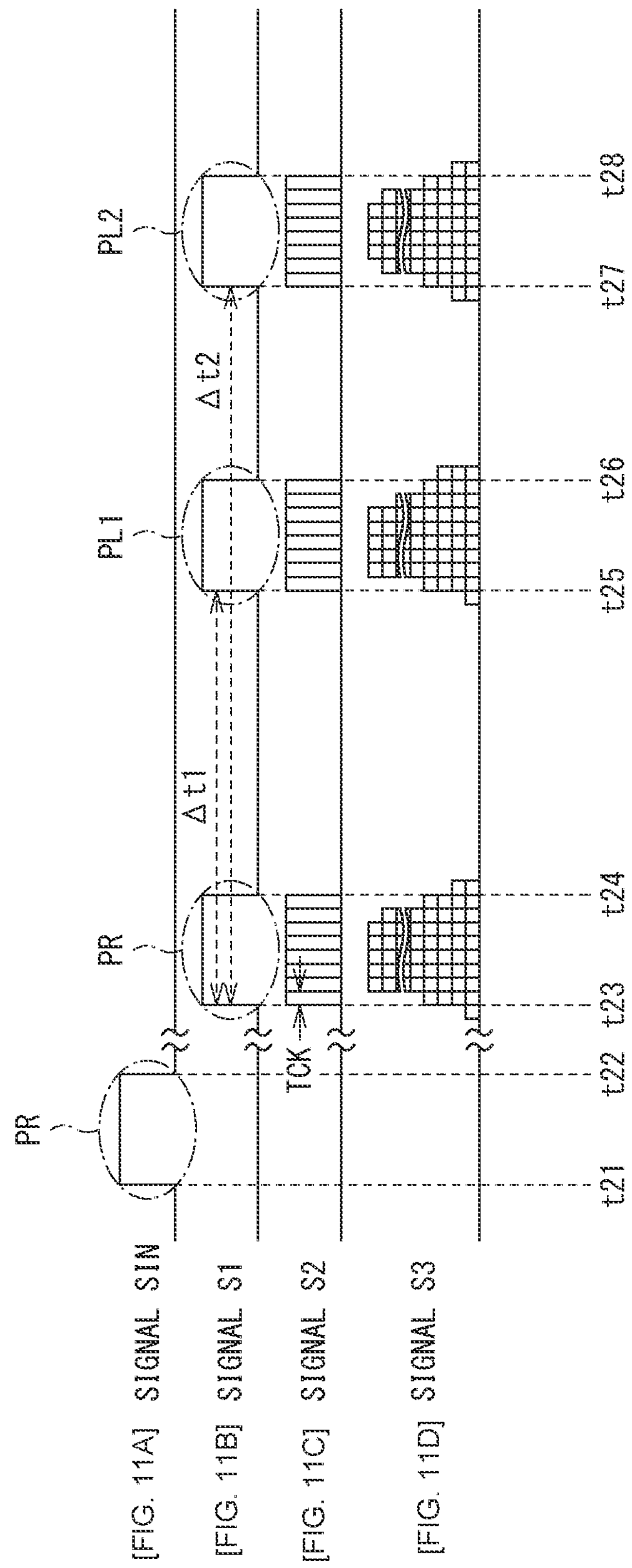
[FIG. 11A] SIGNAL SIN
[FIG. 11B] SIGNAL S1
[FIG. 11C] SIGNAL S2
[FIG. 11D] SIGNAL S3
PR
PR
PL1
PL2
Δt1
Δt2
TCK
t21
t22
t23
t24
t25
t26
t27
t28

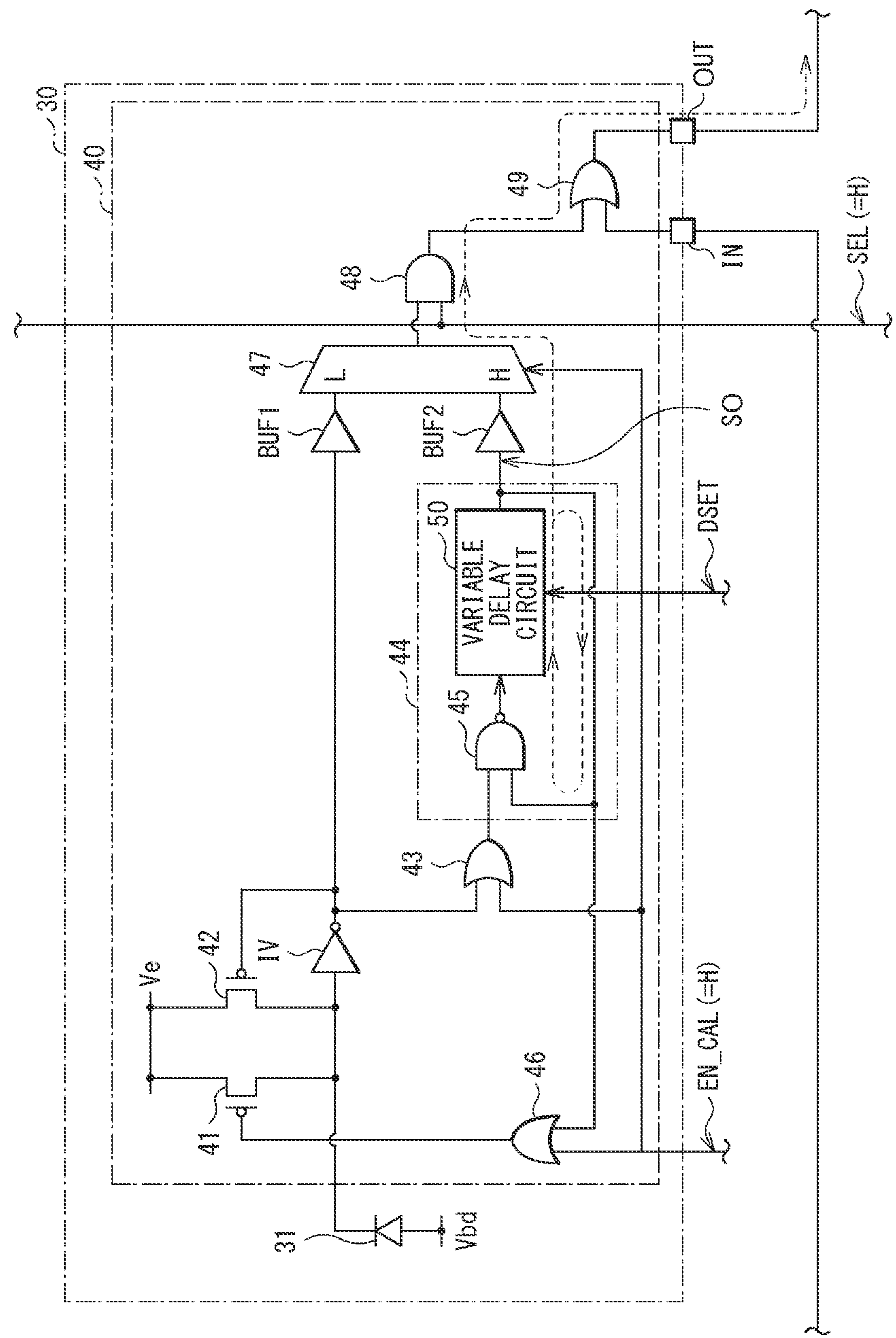
[FIG. 12]

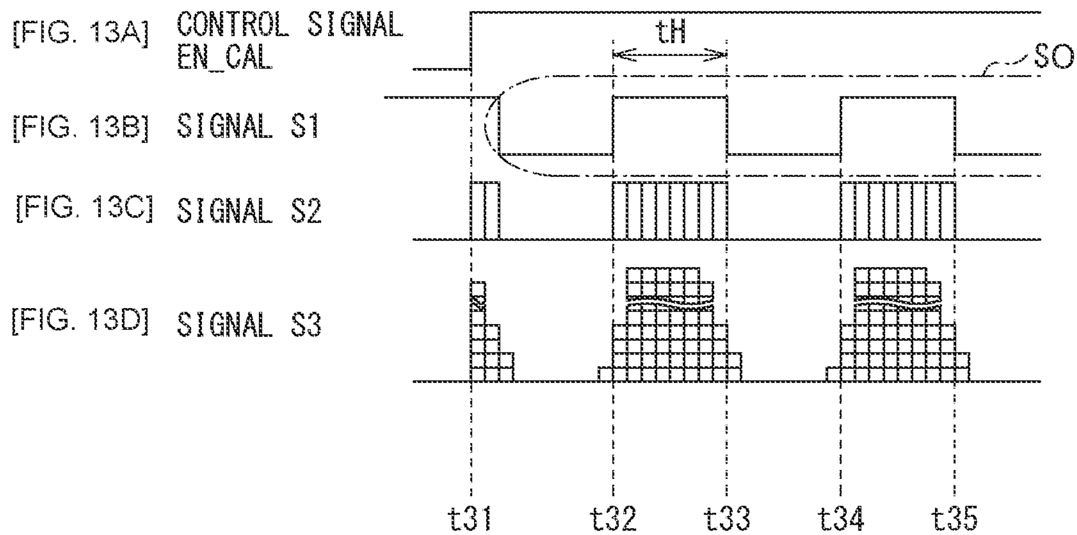
[FIG. 14]
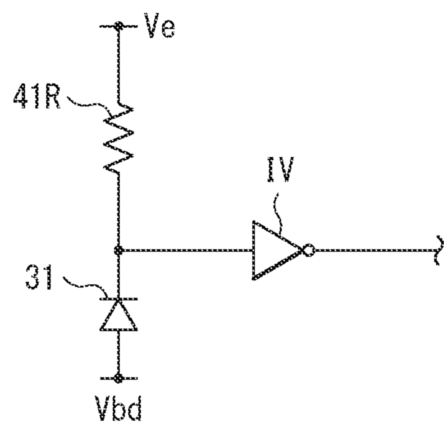

[FIG. 15]
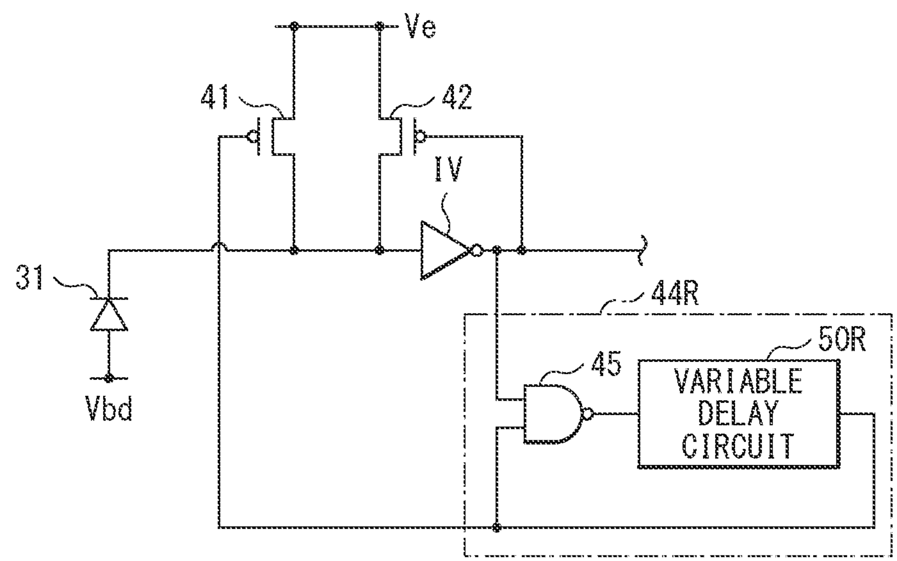
[FIG. 16]
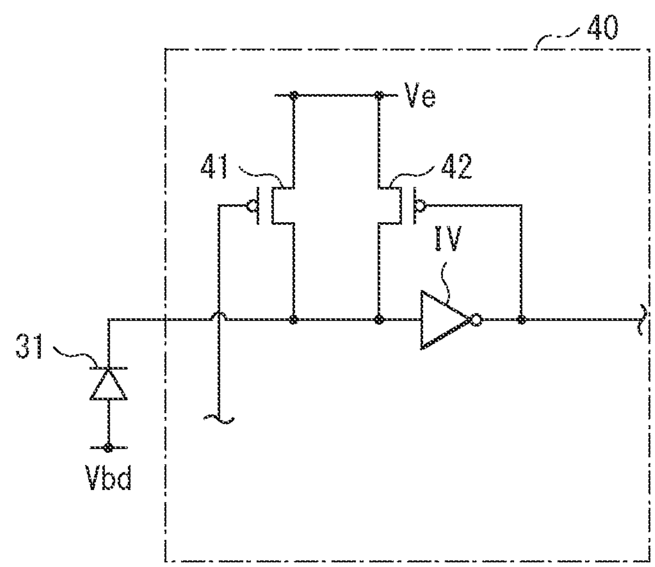

[FIG. 17]
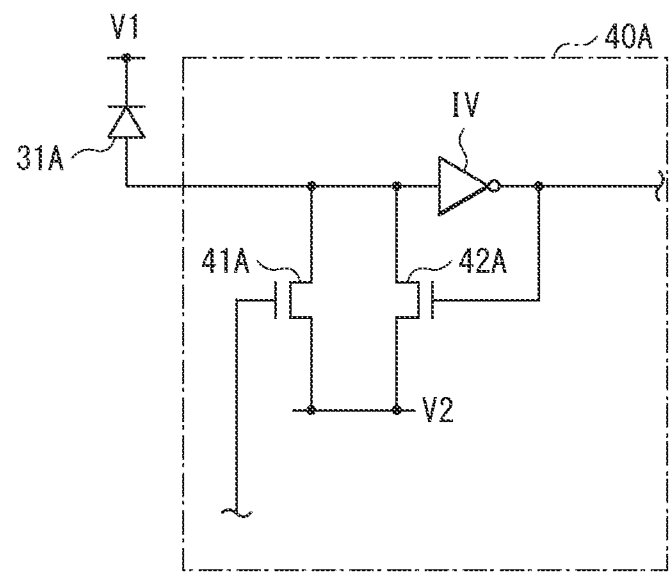
[FIG. 18]
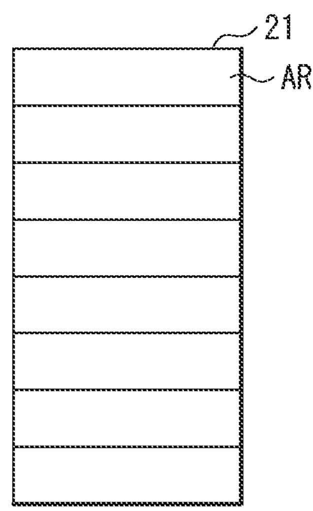

[FIG. 19]
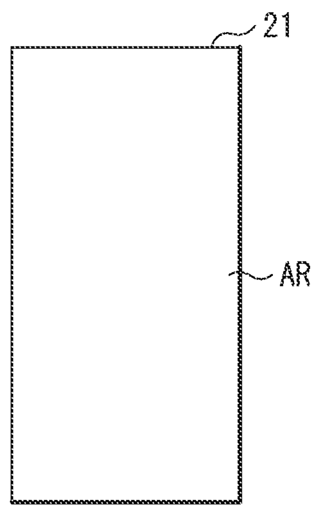
[FIG. 20]
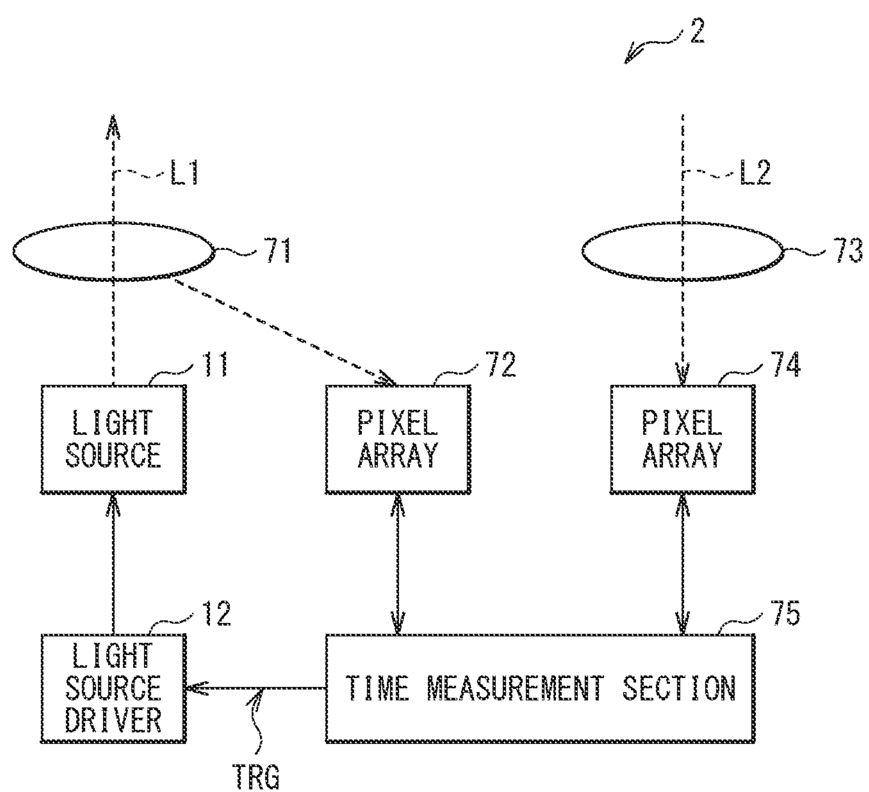

[FIG. 21]
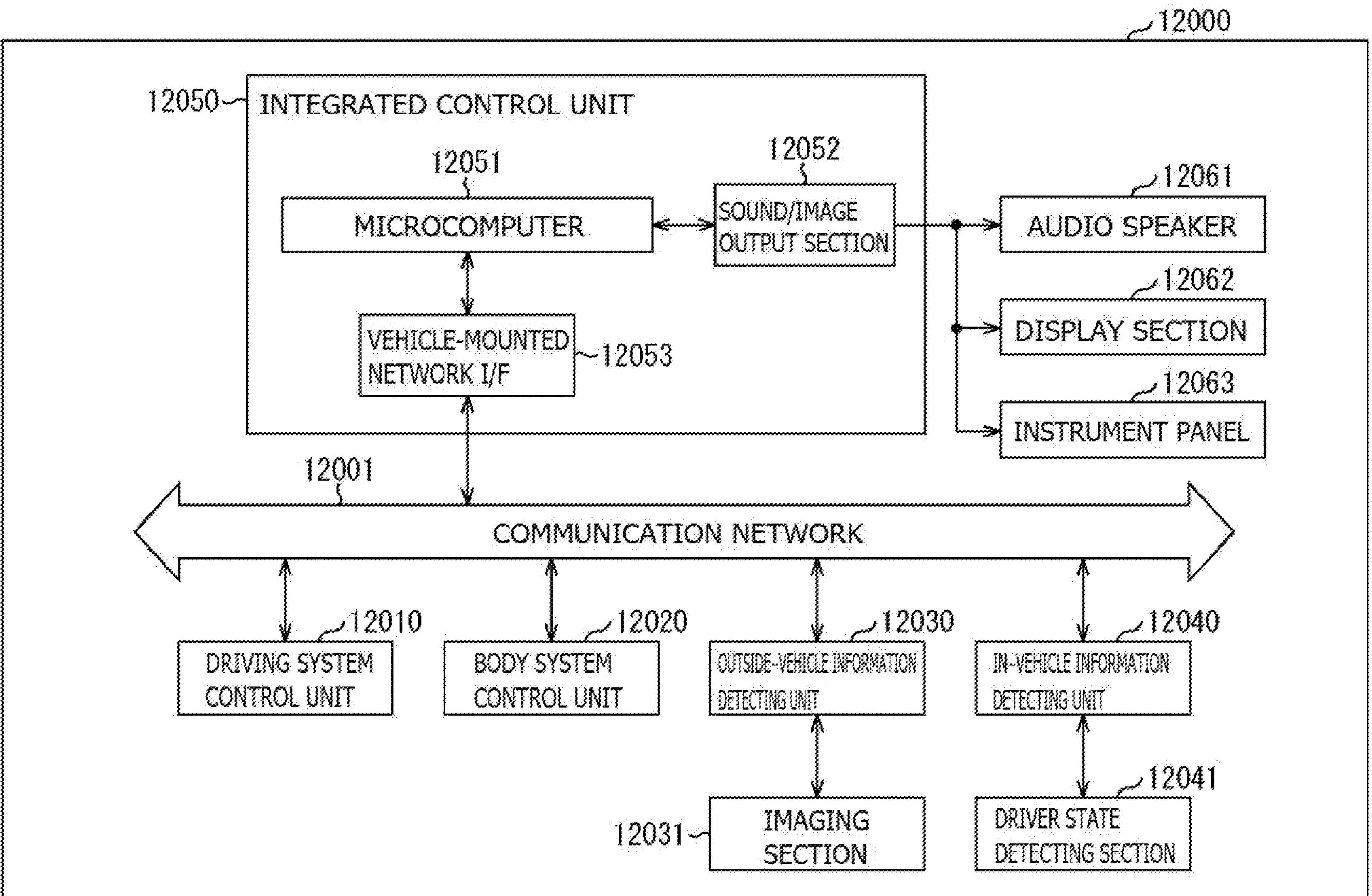

[FIG. 22]
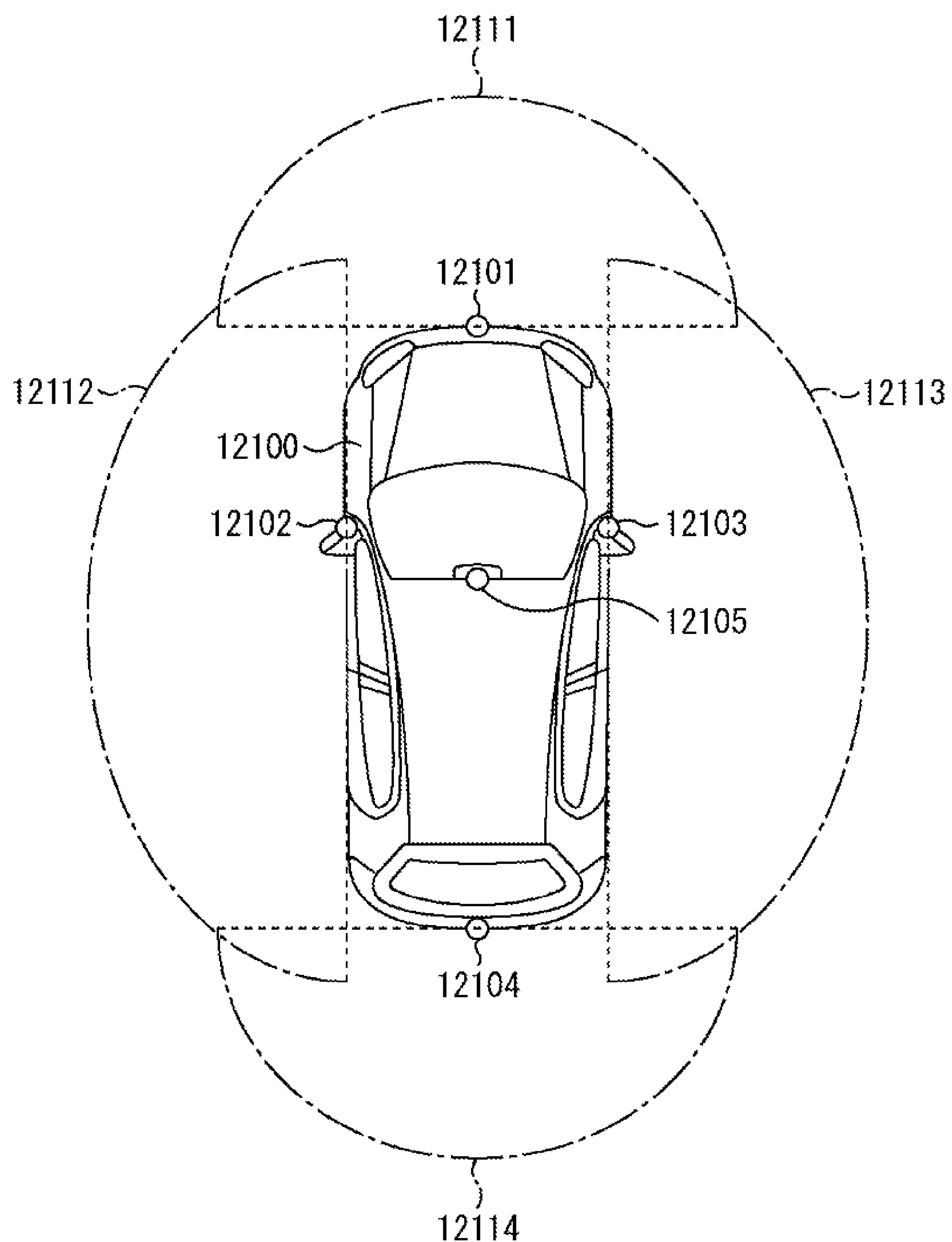

TIME MEASUREMENT DEVICE AND TIME MEASUREMENT APPARATUS

CROSS REFERENCE TO RELATED APPLICATIONS

This application is a U.S. National Phase of International Patent Application No. PCT/JP2019/023197 filed on Jun. 12, 2019, which claims priority benefit of Japanese Patent Application No. JP 2018-148675 filed in the Japan Patent Office on Aug. 7, 2018. Each of the above-referenced applications is hereby incorporated herein by reference in its entirety.

TECHNICAL FIELD

The present disclosure relates to a time measurement device and a time measurement apparatus that measure a time from a timing at which light is outputted to a timing at which light is detected.

BACKGROUND ART

In measuring a distance to a measurement target object, a TOF (Time Of Flight) method is often used. In the TOF method, light is outputted, and reflected light reflected by the measurement target object is detected. In the TOF method, a time difference between a timing at which the light is outputted and a timing at which the reflected light is detected is then measured to measure a distance to the measurement target object (for example, see PTL 1).

Incidentally, an avalanche photodiode is often used for a light receiving element. PTL 1 discloses a light reception apparatus in which an avalanche photodiode and a resistor are coupled in series to each other.

CITATION LIST

Patent Literature

PTL 1: Japanese Unexamined Patent Application Publication No. H9-200142

SUMMARY OF THE INVENTION

In a circuit including such a light receiving element, after a photon is detected, there is a period of time that it is difficult to detect a next photon. The length of this period is also referred to as a dead time. In a time measurement device, a short dead time is desired.

It is desirable to provide a time measurement device and a time measurement apparatus that make it possible to shorten a dead time.

A time measurement device according to an embodiment of the present disclosure includes a pixel and a time measurement section. The pixel includes a light receiving element and a delay circuit having a variable delay time. The pixel is configured to output, as an output signal, a pulse signal that includes a received-light pulse having a pulse width corresponding to the delay time in a first operation mode, and is configured to have a ring oscillator with use of the delay circuit and configured to output, as the output signal, an oscillation signal in the ring oscillator in a second operation mode. The time measurement section is configured to perform time measurement processing on the basis of the output signal.

A time measurement apparatus according to an embodiment of the present disclosure includes a light source, a pixel, and a time measurement section. The light source is configured to emit light. The pixel includes a light receiving element and a delay circuit having a variable delay time. The light receiving element is configured to detect reflected light corresponding to the light. The pixel is configured to output, as an output signal, a pulse signal that includes a received-light pulse having a pulse width corresponding to the delay time in a first operation mode, and is configured to have a ring oscillator with use of the delay circuit and configured to output, as the output signal, an oscillation signal in the ring oscillator in a second operation mode. The time measurement section is configured to perform time measurement processing on the basis of the output signal.

In the time measurement device and the time measurement apparatus according to the embodiments of the present disclosure, the pixel is configured using the light receiving element and the delay circuit having a variable delay time. In the first operation mode, the pulse signal that includes the received-light pulse having a pulse width corresponding to the delay time is outputted from the pixel. In the second operation mode, the ring oscillator is formed using the delay circuit, and the oscillation signal in the ring oscillator is outputted from the pixel. The time measurement processing is then performed on the basis of the signals outputted from the pixel.

According to the time measurement device and the time measurement apparatus according to the embodiments of the present disclosure, in the second operation mode, the pixel outputs the oscillation signal, and the time measurement section performs the time measurement processing on the basis of this signal, which makes it possible to shorten a dead time. It is to be noted that effects described here are not necessarily limitative, and any of effects described in the present disclosure may be provided.

BRIEF DESCRIPTION OF DRAWINGS

FIG. 1 is a configuration diagram illustrating a configuration example of a time measurement apparatus according to an embodiment of the present disclosure.

FIG. 2 is a block diagram illustrating a configuration example of a time measurement device illustrated in FIG. 1.

FIG. 3 is an explanatory diagram illustrating a configuration example of a pixel array illustrated in FIG. 1.

FIG. 4 is a circuit diagram illustrating a configuration example of a pixel illustrated in FIG. 3.

FIG. 5A is a circuit diagram illustrating a configuration example of a ring oscillator illustrated in FIG. 4.

FIG. 5B is a circuit diagram illustrating another configuration example of the ring oscillator illustrated in FIG. 4.

FIG. 5C is a circuit diagram illustrating another configuration example of the ring oscillator illustrated in FIG. 4.

FIG. 5D is a circuit diagram illustrating another configuration example of the ring oscillator illustrated in FIG. 4.

FIG. 5E is a circuit diagram illustrating another configuration example of the ring oscillator illustrated in FIG. 4.

FIG. 6 is an explanatory diagram illustrating an example of processing of adjusting a delay time of a variable delay circuit.

FIG. 7 is an explanatory diagram illustrating an implementation example of the time measurement device illustrated in FIG. 2.

FIGS. 8A, 8B, 8C, 8D, 8E, and 8F are timing waveform charts illustrating an operation example of the time measurement apparatus illustrated in FIG. 1.

FIG. 9 is an explanatory diagram illustrating an operation example of the pixel illustrated in FIG. 4.

FIGS. 10A, 10B, 10C, 10D, and 10E are timing waveform charts illustrating an operation example of the pixel illustrated in FIG. 4.

FIGS. 11A, 11B, 11C, and 11D are timing charts illustrating an operation example of the time measurement device illustrated in FIG. 2.

FIG. 12 is an explanatory diagram illustrating another operation example of the pixel illustrated in FIG. 4.

FIGS. 13A, 13B, 13C, and 13D are timing charts illustrating another operation example of the time measurement device illustrated in FIG. 2.

FIG. 14 is a circuit diagram illustrating a configuration example of a pixel according to a comparative example.

FIG. 15 is a circuit diagram illustrating a configuration example of a pixel according to another comparative example, FIG. 16 is a circuit diagram illustrating a configuration example of the pixel illustrated in FIG. 4.

FIG. 17 is a circuit diagram illustrating a configuration example of a pixel according to a modification example.

FIG. 18 is an explanatory diagram illustrating an example of processing of adjusting a delay time of a variable delay circuit according to another modification example.

FIG. 19 is an explanatory diagram illustrating an example of processing of adjusting a delay time of a variable delay circuit according to another modification example.

FIG. 20 is a configuration diagram illustrating a configuration example of a time measurement apparatus according to an application example.

FIG. 21 is a block diagram depicting an example of schematic configuration of a vehicle control system.

FIG. 22 is a diagram of assistance in explaining an example of installation positions of an outside-vehicle information detecting section and an imaging section.

MODES FOR CARRYING OUT THE INVENTION

Hereinafter, some embodiments of the present disclosure are described in detail with reference to the drawings. It is to be noted that description is given in the following order.

1. Embodiment
2. Application Example
3. Practical Application Example to Mobile Body

1. Embodiment

Configuration Example

FIG. 1 illustrates a configuration example of a time measurement apparatus (a time measurement apparatus 1) according to an embodiment. The time measurement apparatus 1 is configured to output light and detect reflected light reflected by a measurement target object to measure a time difference between a timing at which the light is outputted and a timing at which the reflected light is detected. The time measurement apparatus 1 includes a light source 11, a light source driver 12, a diffusing lens 13, a light collecting mirror 14, and a time measurement device 20.

The light source 11 is configured to be driven by the light source driver 12 to emit light. The light source 11 is configured using a pulse laser light source, for example.

The light source driver 12 is configured to drive the light source 11 on the basis of a light-emission trigger signal TRG. Specifically, the light source driver 12 controls an operation of the light source 11 on the basis of the light-emission trigger signal TRG supplied from the time measurement device 20 to cause the light source 11 to emit light at a timing corresponding to a trigger pulse included in the light-emission trigger signal TRG.

The diffusing lens 13 is configured to diffuse the light emitted from the light source 11 within a predetermined angle range. The light (output light L1) diffused by the diffusing lens 13 is then outputted from the time measurement apparatus 1.

The light collecting mirror 14 is configured to reflect, toward a light reception surface S of the time measurement device 20, light (reflected light L2) having been reflected by a measurement target object 9 and entered the time measurement apparatus 1.

The time measurement device 20 is configured to detect the light reflected by the light collecting mirror 14 and measure a time difference between a timing at which the light source 11 emits light and a timing at which a light receiving element 31 (to be described later) of the time measurement device 20 detects light. Light entering the time measurement device 20 is substantially the same as the light having been reflected by the measurement target object 9 and entered the time measurement apparatus 1; therefore, for the sake of convenience of description, the light entering the time measurement device 20 is hereinafter also referred to as "reflected light L2". In addition, the time measurement device 20 also performs an operation of generating the light-emission trigger signal TRG and supplying the generated light-emission trigger signal TRG to the light source driver 12.

In addition, in a calibration mode, the time measurement device 20 performs calibration processing for adjusting a delay time of a variable delay circuit 50 included in a pixel 30, as described later.

FIG. 2 illustrates a configuration example of the time measurement device 20. The time measurement device 20 includes a pixel array 21, a selection signal generator 22, a signal generator 23, a synchronizer 24, an adder 25, a histogram generator 26, a processor 27, and a controller 28. The pixel array 21 includes a plurality of pixels 30 arranged in a matrix.

FIG. 3 illustrates a configuration example of the pixel array 21. FIG. 3 illustrates four (=2×2) pixels 30 of the plurality of pixels 30 in the pixel array 21. FIG. 4 illustrates a configuration example of the pixel 30. The pixel 30 includes the light receiving element 31 and a pixel circuit 40.

The light receiving element 31 is a photoelectric converter that detects light, and is configured using a single-photon avalanche diode (SPAD). The light receiving element 31 has an anode supplied with a voltage Vbd, and a cathode coupled to the pixel circuit 40.

The pixel circuit 40 includes transistors 41 and 42, an inverter IV, a logical OR (OR) circuit 43, a ring oscillator 44, a logical OR circuit 46, level conversion circuits BUF1 and BUF2, a selector 47, a logical AND (AND) circuit 48, and a logical OR circuit 49, as illustrated in FIG. 4.

The transistors 41 and 42 are P-type MOS (Metal Oxide Semiconductor) transistors. The transistor 41 has a source supplied with a voltage Ve, a gate coupled to an output terminal of the logical OR circuit 46, and a drain coupled to the cathode of the light receiving element 31, a drain of the transistor 42, and an input terminal of the inverter IV. The transistor 42 has a source supplied with the voltage Ve, a gate coupled to an output terminal of the inverter IV, a first input terminal of the logical OR circuit 43, and an input terminal of the level conversion circuit BUF1, and the drain coupled to the cathode of the light receiving element 31, the drain of the transistor 41, and the input terminal of the inverter IV.

The inverter IV has the input terminal coupled to the cathode of the light receiving element 31 and the drains of the transistors 41 and 42, and the output terminal coupled to the gate of the transistor 42, the first input terminal of the logical OR circuit 43, and the input terminal of the level conversion circuit BUF1.

The logical OR circuit 43 has the first input terminal coupled to the output terminal of the inverter IV, the gate of the transistor 42, and the input terminal of the level conversion circuit BUF1, a second input terminal supplied with a control signal EN_CAL, and an output terminal coupled to the ring oscillator 44.

The ring oscillator 44 includes an inverted logical AND (NAND) circuit 45 and the variable delay circuit 50. The inverted logical AND circuit 45 has a first input terminal coupled to an output terminal of the logical OR circuit 43, a second input terminal coupled to an output terminal of the variable delay circuit 50, an input terminal of the level conversion circuit BUF2, and a second input terminal of the logical OR circuit 46, and an output terminal coupled to an input terminal of the variable delay circuit 50. The variable delay circuit 50 is configured to delay a signal supplied from the inverted logical AND circuit 45 by a delay time corresponding to a control signal DSET. The variable delay circuit 50 has the input terminal coupled to the output terminal of the inverted logical AND circuit 45, and the output terminal coupled to the input terminal of the level conversion circuit BUF2, the second input terminal of the inverted logical AND circuit 45, and the second input terminal of the logical OR circuit 46.

In the ring oscillator 44, in a case where a signal at the first input terminal of the inverted logical AND circuit 45 is in a high level, the inverted logical AND circuit 45 inverts a signal at the second input terminal, and outputs the inverted signal. This causes the ring oscillator 44 to perform an oscillation operation and generate an oscillation signal SO having a frequency corresponding to a delay time in the variable delay circuit 50. In addition, in a case where the signal at the first input signal is in a low level, the inverted logical AND circuit 45 outputs a high level. This causes the ring oscillator 44 to stop the oscillation operation.

FIGS. 5A, 5B, 50, 5D, and 5E illustrate specific examples of the ring oscillator 44. The variable delay circuits 50 in these ring oscillators 44 have configurations different from each other.

The ring oscillator 44 (a ring oscillator 44A) illustrated in FIG. 5A includes a variable delay circuit 50A. The variable delay circuit 50A includes four inverters 51 to 54 and a current source 59A. Each of the four inverters 51 to 54 is a CMOS (complementary metal oxide semiconductor) inverter, for example. The inverter 51 has an input terminal coupled to an input terminal Tin of the variable delay circuit 50A, and an output terminal coupled to an input terminal of the inverter 52. The inverter 52 has the input terminal coupled to the output terminal of the inverter 51, and an output terminal coupled to an input terminal of the inverter 53. The inverter 53 has the input terminal coupled to the output terminal of the inverter 52, and an output terminal coupled to an input terminal of the inverter 54. The inverter 54 has the input terminal coupled to the output terminal of the inverter 53, and an output terminal coupled to an output terminal Tout of the variable delay circuit 50A. Power source terminals of the inverters 51 to 54 are coupled to the current source 59A. The current source 59A is configured to cause a current to flow from one end toward another end, and is configured to make a current value of the current changeable on the basis of the control signal DSET. The current source 59A has one end supplied with the voltage Ve, and another end coupled to the power source terminals of the inverters 51 to 54.

In the ring oscillator 44A, a delay time in the variable delay circuit 50A is changed in accordance with the current value of a current generated by the current source 59A. Specifically, for example, in a case where the current value of the current generated by the current source 59A is large, delay times in the inverters 51 to 54 are decreased, and in a case where the current value of the current generated by the current source 59A is small, the delay times in the inverters 51 to 54 are increased. The ring oscillator 44A performs an oscillation operation at a frequency corresponding to the delay time in the variable delay circuit 50A in such a manner.

The ring oscillator 44 (a ring oscillator 44B) illustrated in FIG. 5B includes a variable delay circuit 50B. The variable delay circuit 50B includes four inverters 51 to 54 and four current sources 51B, 52B, 53B, and 54B. Each of the current sources 51B, 52B, 53B, and 54B is configured to cause a current to flow from one end toward another end, and is configured to make a current value of the current changeable on the basis of the control signal DSET. The current source 51B has one end supplied with the voltage Ve, and another end coupled to the power source terminal of the inverter 51. The current source 52B has one end supplied with the voltage Ve, and another end coupled to the power source terminal of the inverter 52. The current source 53B has one end supplied with the voltage Ve, and another end coupled to the power source terminal of the inverter 53. The current source 54B has one end supplied with the voltage Ve, and another end coupled to the power source terminal of the inverter 54.

In the ring oscillator 44B, a delay time in the variable delay circuit 50B is changed in accordance with current values of currents generated by the current sources 51B, 52B, 53B, and 54B. Specifically, for example, in a case where the current value of the current generated by the current source 51B is large, a delay time in the inverter 51 is decreased, and in a case where the current value of the current generated by the current source 51B is small, the delay time in the inverter 51 is increased. The same applies to the inverters 52 to 54. Accordingly, the ring oscillator 44B performs an oscillation operation at a frequency corresponding to the delay time in the variable delay circuit 50B.

The ring oscillator 44 (a ring oscillator 44C) illustrated in FIG. 5C includes a variable delay circuit 50C. The variable delay circuit 50C includes four inverters 51 to 54 and four variable capacitors 51C, 52C, 53C, and 54C. Each of the four variable capacitors 51C, 52C, 53C, and 54C is configured to make a capacitance value changeable on the basis of the control signal DSET. The variable capacitor 51C has one end coupled to the output terminal of the inverter 51 and the input terminal of the inverter 52, and another terminal grounded. The variable capacitor 52C has one end coupled to the output terminal of the inverter 52 and the input terminal of the inverter 53, and another end grounded. The variable capacitor 53C has one end coupled to the output terminal of the inverter 53 and the input terminal of the inverter 54, and another end grounded. The variable capacitor 54C has one end coupled to the output terminal of the inverter 53 and the second input terminal of the inverted logical AND circuit 45, and another end grounded.

In the ring oscillator 44C, a delay time in the variable delay circuit 50C is changed in accordance with capacitance values of the variable capacitors 51C, 52C, 53C, and 54C. Specifically, for example, in a case where the capacitance value of the variable capacitor 51C is small, the delay time in the inverter 51 is decreased, and in a case where the capacitance value of the variable capacitor 51C is large, the delay time in the inverter 51 is increased. The same applies to the inverters 52 to 54. The ring oscillator 44C performs an oscillation operation at a frequency corresponding to the delay time in the variable delay circuit 50C in such a manner.

The ring oscillator 44 (a ring oscillator 44D) illustrated in FIG. 5D includes a variable delay circuit 50D. The variable delay circuit 50D includes two inverters 51 and 52, a current source 51D, and a variable capacitor 57D. The inverter 52 has the output terminal coupled to an output terminal Tout of the variable delay circuit 50D. The current source 51D is configured to cause a current to flow from one end toward another end, and is configured to make a current value of the current changeable on the basis of the control signal DSET. The current source 51D has one end supplied with the voltage Ve, and another end coupled to the power source terminal of the inverter 51. The variable capacitor 57D is configured to make a capacitance value changeable on the basis of the control signal DSET. The variable capacitor 57D has one end coupled to the output terminal of the inverter 51 and the input terminal of the inverter 52, and another end grounded.

In the ring oscillator 44D, a delay time in the variable delay circuit 50D is changed in accordance with a current value of a current generated by the current source 51D and a capacitance value of the variable capacitor 57D. Specifically, for example, in a case where the current value of the current generated by the current source 51D is large and the capacitance value of the variable capacitor 57D is small, the delay time in the inverter 51 is decreased. In addition, for example, in a case where the current value of the current generated by the current source 51D is small and the capacitance value of the variable capacitor 57D is large, the delay time in the inverter 51 is increased. The ring oscillator 44D performs an oscillation operation at a frequency corresponding to the delay time in the variable delay circuit 50D in such a manner. The ring oscillator 44D includes the current source 51D and the variable capacitor 57D, which makes it possible to expand a variable range of the delay time in the inverter 51, and consequently makes it possible to reduce the number of inverters in the variable delay circuit 50D.

The ring oscillator 44 (a ring oscillator 44E) illustrated in FIG. 5E includes a variable delay circuit 50E. The variable delay circuit 50E includes six inverters 51 to 56 and a selector 58. The inverter 52 has the output terminal coupled to the input terminal of the inverter 53 and a first input terminal of the selector 58. The inverter 54 has the output terminal coupled to an input terminal of the inverter 55 and a second input terminal of the selector 58. The inverter 55 has the input terminal coupled to the output terminal of the inverter 54, and an output terminal coupled to an input terminal of the inverter 56. The inverter 56 has the input terminal coupled to the output terminal of the inverter 55, and an output terminal coupled to a third input terminal of the selector 58. The selector 58 is configured to select one of a signal at the first input terminal, a signal at the second input terminal, and a signal at the third input terminal on the basis of the control signal DSET and output the selected signal from an output terminal. The selector 58 has the first input terminal coupled to the output terminal of the inverter 52 and the input terminal of the inverter 53, the second input terminal coupled to the output terminal of the inverter 54 and the input terminal of the inverter 55, the third input terminal coupled to the output terminal of the inverter 56, and the output terminal coupled to the output terminal Tout of the variable delay circuit 50E.

In the ring oscillator 44E, the delay time in the variable delay circuit 50E is changed in accordance with a selection operation in the selector 58. Specifically, for example, the delay time in the variable delay circuit 50E becomes a total time of delay times in the two inverters 51 and 52 and a delay time in the selector 58 in a case where the selector 58 selects the signal at the first input terminal, a total time of delay times in the four inverters 51 to 54 and the delay time in the selector 58 in a case where the selector 58 selects the signal at the second input terminal, and a total time of delay times in the six inverters 51 to 56 and the delay time in the selector 58 in a case where the selector 58 selects the signal at the third input terminal. The ring oscillator 44E performs an oscillation operation at a frequency corresponding to the delay time in the variable delay circuit 50E in such a manner.

Thus, in the ring oscillator 44, the variable delay circuit 50 is configured to make a delay time changeable on the basis of the control signal DSET. As illustrated in FIG. 6, in the pixel array 21, the delay time of the variable delay circuit 50 is adjusted in units of areas AR. In this example, the pixel array 21 is partitioned into 32 (=4×8) areas AR. Each of a plurality of areas AR includes a plurality of pixels 30. One control signal is supplied to the variable delay circuits 50 in a plurality of pixels 30 belonging to one area AR. This makes delay settings in a plurality of variable delay circuits 50 belonging to the one area AR the same. Thus, the delay times of the variable delay circuits 50 are adjusted in units of areas AR.

The logical OR circuit 46 (FIG. 4) has the first input terminal supplied with a control signal EN_CAL, the second input terminal coupled to the output terminal of the variable delay circuit 50, the input terminal of the level conversion circuit BUF2, and the second input terminal of the inverted logical AND circuit 45, and the output terminal coupled to the gate of the transistor 41.

The level conversion circuits BUF1 and BUF2 are configured to convert a voltage level of a signal at the input terminal and output the thus-converted signal from the output terminal. The level conversion circuit BUF1 has the input terminal coupled to the output terminal of the inverter IV, the gate of the transistor 42, and the first input terminal of the logical OR circuit 43, and the output terminal coupled to a first input terminal of the selector 47. The level conversion circuit BUF2 has the input terminal coupled to the output terminal of the variable delay circuit 50, the second input terminal of the inverted logical AND circuit 45, and the second input terminal of the logical OR circuit 46, and another end coupled to a second input terminal of the selector 47.

The selector 47 is configured to select one of a signal at the first input terminal and a signal at the second input terminal on the basis of the control signal EN_CAL and output the selected signal from an output terminal. The selector 47 has the first input terminal coupled to the output terminal of the level conversion circuit BUF1, the second input terminal coupled to the output terminal of the level conversion circuit BUF2, and the output terminal coupled to a first input terminal of the logical AND circuit 48. The selector 47 selects the signal at the first input terminal in a case where the control signal EN_CAL is in a low level (L), and selects the signal at the second input terminal in a case where the control signal EN_CAL is in a high level (H).

The logical AND circuit 48 has the first input terminal coupled to the output terminal of the selector 47, a second input terminal supplied with a selection signal SEL, and an output terminal coupled to a first input terminal of the logical OR circuit 49.

The logical OR circuit 49 has the first input terminal coupled to the output terminal of the logical AND circuit 48, a second input terminal coupled to an input terminal IN of the pixel 30, and an output terminal coupled to an output terminal OUT of the pixel 30.

With this configuration, in the pixel 30, in a case where the control signal EN_CAL is in the low level, a received-light pulse PL having a pulse width corresponding to the delay time of the variable delay circuit 50 is generated every time the light receiving element 31 receives the reflected light L2, and the selector 47 outputs a pulse signal SP including this received-light pulse PL. In addition, in a case where the control signal EN_CAL is in the high level, the pixel 30 operates in the calibration mode, the ring oscillator 44 performs an oscillation operation to generate the oscillation signal SO, and the selector 47 outputs this oscillation signal SO.

As illustrated in FIG. 2, a signal SIN supplied from the signal generator 23 is inputted into the input terminal IN of the leftmost pixel 30 of the pixels 30 in one row disposed side by side in a transverse direction in the pixel array 21. In addition, the input terminal IN of each of the pixels 30 other than the leftmost pixel 30 of the pixels 30 in this one row is coupled to the output terminal OUT of the pixel 30 adjacent, on the left, to that pixel 30, as illustrated in FIG. 3. The output terminal OUT of the rightmost pixel 30 of the pixels 30 in this one row is then coupled to the synchronizer 24, as illustrated in FIG. 2. This rightmost pixel 30 then outputs a signal S1. In the pixel array 21, the pixels 30 in one row disposed side by side in the transverse direction in FIG. 2 are daisy-chain coupled in such a manner.

In addition, one selection signal SEL is supplied to the pixels 30 in one column disposed side by side in a longitudinal direction in the pixel array 21, and the selection signals SEL different from each other are supplied to the pixels 30 belonging to columns different from each other. In other words, a corresponding signal SEL is supplied to each of the pixels 30 in one row disposed side by side in the transverse direction. With this configuration, in the pixel array 21, a plurality of the pixels 30 is selected as a unit of the pixels 30 in one column with use of the selection signal SEL.

The selection signal generator 22 is configured to generate a plurality of selection signals SEL on the basis of a control signal supplied from the controller 28. The selection signal generator 22 supplies each of the plurality of selection signals SEL to a corresponding one of a plurality of columns of the pixels 30 in the pixel array 21. This allows the selection signal generator 22 to select a plurality of pixels 30 sequentially on a column-by-column basis.

The signal generator 23 is configured to generate a signal SIN including a reference pulse PR on the basis of a control signal supplied from the controller 28. The reference pulse PR is generated at a timing corresponding to a timing at which the light source 11 emits light.

The synchronizer 24 is configured to generate each of a plurality of signals S2 by sampling each of a plurality of signals S1 supplied from the pixel array 21 with the clock signal CK supplied from the controller 28. The synchronizer 24 includes a plurality of flip-flops 64. The plurality of flip-flops 64 is provided corresponding to a plurality of rows of the pixels 30 in the pixel array 21. Each of the plurality of flip-flops 64 is configured to generate the signal S2 by sampling the signal S1 supplied from a corresponding row of the pixels 30 with the clock signal CK.

The adder 25 is configured to generate a plurality of signals S3 by performing addition processing on the basis of the plurality of signals S2 supplied from the synchronizer 24 and a control signal supplied from the controller 28. The adder 25 includes a plurality of addition circuits 65. Each of the plurality of addition circuits 65 is provided corresponding to a plurality of rows in the area AR in the pixel array 21. For example, as illustrated in FIG. 6, in a case where the pixel array 21 has eight rows of the areas AR, the adder 25 includes eight addition circuits 65. Each of the plurality of addition circuits 65 is configured to generate the signal S3 by performing addition processing on the basis of the plurality of signals S2 outputted from the plurality of flip-flops 64 related to rows in a corresponding area AR.

The histogram generator 26 is configured to perform histogram generation processing on the basis of the plurality of signals S3 supplied from the adder 25 and a control signal supplied from the controller 28. The histogram generator 26 includes a plurality of histogram generation circuits 66. The plurality of histogram generation circuits 66 is provided corresponding to the plurality of addition circuits 65. Each of the plurality of histogram generation circuits 66 is configured to generate a histogram by performing histogram generation processing on the basis of the signal S3 supplied from a corresponding one of the addition circuits 65.

The processor 27 is configured to generate a depth image PIC on the basis of information about the histograms supplied from the histogram generator 26 and a control signal supplied from the controller 28. Each of a plurality of pixel values included in the depth image PIC indicates a depth value. The processor 27 outputs the generated depth image PIC.

The processor 27 includes a delay time measurement section 27A. In a case where the time measurement device 20 operates in the calibration mode, the delay time measurement section 27A is configured to measure the delay times of the variable delay circuits 50 on the basis of the information about the histograms supplied from the histogram generator 26 and a control signal supplied from the controller 28. The delay time measurement section 27A then supplies information about the measured delay times to the controller 28.

The controller 28 is configured to control the operation of the time measurement apparatus 1 by supplying control signals to the pixel array 21, the selection signal generator 22, the signal generator 23, the synchronizer 24, the adder 25, the histogram generator 26, and the processor 27 and supplying the light-emission trigger signal TRG to the light source driver 12. The controller 28 includes a light-emission timing setter 28A and a delay controller 28B.

The light-emission timing setter 28A is configured to generate the light-emission trigger signal TRG that indicates a light-emission timing in the light source 11. The light-emission trigger signal TRG includes a plurality of trigger pulses. The controller 28 supplies the light-emission trigger signal TRG to the light source driver 12, thereby controlling an operation of the light source 11 to cause the light source 11 to emit light at timings corresponding to the trigger pulses included in the light-emission trigger signal TRG.

The delay controller 28B is configured to control the delay times of the variable delay circuits 50 of the pixels 30. Specifically, the delay controller 28B sets the control signal EN_CAL to a high level (active) in a case where the delay controller 28B operates in the calibration mode. The delay controller 28B then determines setting of the delay time of the variable delay circuit 50 of each of the plurality of pixels 30 in the pixel array 21 in units of the areas AR on the basis of information supplied from the delay time measurement section 27A of the processor 27. The delay controller 28B then generates a control signal DSET on the basis of a determination result. This causes the delay time of each of the plurality of variable delay circuits 50 to be set to a time having a predetermined length.

The time measurement device 20 is formed on two semiconductor substrates superimposed on each other, for example.

FIG. 7 illustrates a configuration example of the time measurement device 20. The time measurement device 20 is configured using two semiconductor substrates 111 and 112 superimposed on each other in this example. The light receiving elements 31 in the pixel array 21 are formed on the semiconductor substrate 111. Accordingly, in the time measurement device 20, a surface where the semiconductor substrate 111 is disposed is the light reception surface S. The pixel circuits 40 in the pixel array 21 are formed on regions, corresponding to regions where the light receiving elements 31 are formed on the semiconductor substrate 111, of the semiconductor substrate 112. In addition, on the semiconductor substrate 112, the selection signal generator 22, the signal generator 23, the synchronizer 24, the adder 25, the histogram generator 26, the processor 27, and the controller 28 are further formed. The semiconductor substrate 111 and the semiconductor substrate 112 are superimposed on each other, and are electrically coupled to each other by Cu—Cu bonding, for example.

Here, the variable delay circuit 50 corresponds to a specific example of a "delay circuit" in the present disclosure. The synchronizer 24, the adder 25, the histogram generator 26, and the processor 27 correspond to specific examples of a "time measurement section" in the present disclosure. The transistor 41 corresponds to a specific example of a "switch" in the present disclosure. The selector 47 corresponds to a specific example of a "selector" in the present disclosure.

[Operation and Workings]

Next, description is given of the operation and workings of the time measurement apparatus 1 according to the present embodiment.

(Overview of Overall Operation)

First, description is given of an overview of an overall operation of the time measurement apparatus 1 with reference to FIGS. 1 and 2. The light-emission timing setter 28A of the controller 28 generates the light-emission trigger signal TRG that indicates light-emission timings in the light source 11. The light source driver 12 drives the light source 11 on the basis of the light-emission trigger signal TRG. The light source 11 emits light at timings corresponding to the trigger pulses included in the light-emission trigger signal TRG. The diffusing lens 13 diffuses the light emitted from the light source 11 within a predetermined angle range. The light (the output light L1) diffused by the diffusing lens 13 is outputted from the time measurement apparatus 1. The light collecting mirror 14 reflects, toward the light reception surface S of the time measurement device 20, light (the reflected light L2) having been reflected by the measurement target object 9 and entered the time measurement apparatus 1.

The time measurement device 20 detects the light reflected by the light collecting mirror 14 to generate the depth image PIC. Specifically, the selection signal generator 22 generates a plurality of selection signals SEL on the basis of the control signal supplied from the controller 28 to select a plurality of pixels 30 in the pixel array 21 sequentially on a column-by-column basis. The signal generator 23 generates the signal SIN on the basis of the control signal supplied from the controller 28. A plurality of pixels 30 belonging to a selected column in the pixel array 21 each outputs the pulse signal SP including the received-light pulse PL corresponding to the reflected light L2. This causes the pixel array 21 to output these pulse signals SP as a plurality of signals S1. The synchronizer 24 samples each of the plurality of signals S1 with the clock signal CK to generate each of a plurality of signals S2. The adder 25 performs addition processing on the basis of the plurality of signals S2 to generate a plurality of signals S3. The histogram generator 26 performs histogram generation processing on the basis of the plurality of signals S3. The processor 27 generates the depth image PIC on the basis of information about the histograms supplied from the histogram generator 26.

In a case where the time measurement device 20 operates in the calibration mode, the delay controller 28B of the controller 28 sets the control signal EN_CAL to the high level (active). The selection signal generator 22 generates a plurality of selection signals SEL on the basis of the control signal supplied from the controller 28 to select a plurality of pixels 30 in the pixel array 21 sequentially on a column-by-column basis. In a plurality of pixels 30 belonging to a selected column in the pixel array 21, the ring oscillators 44 perform an oscillation operation. This causes each of the plurality of pixels 30 to output the oscillation signal SO having a frequency corresponding to the delay time in the variable delay circuit 50. This causes the pixel array 21 to output these oscillation signals SO as a plurality of signals S1. The synchronizer 24 samples each of the plurality of signals S1 with the clock signal CK to generate each of a plurality of signals S2. The adder 25 performs addition processing on the basis of the plurality of signals S2 to generate a plurality of signals S3. The histogram generator 26 performs histogram generation processing on the basis of the plurality of signals S3. The delay time measurement section 27A of the processor 27 measures the delay times of the variable delay circuits 50 on the basis of information about the histograms supplied from the histogram generator 26. The delay time measurement section 27A then supplies information about the measured delay times to the controller 28. The delay controller 28B of the controller 28 determines setting of the delay time of the variable delay circuit 50 of each of the plurality of pixels 30 in the pixel array 21 in each of the areas AR on the basis of information supplied from the delay time measurement section 27A. The delay controller 28B then generates the control signal DSET on the basis of a determination result. This causes the delay time of each of the plurality of variable delay circuits 50 to be set to a time having a predetermined length.

(Details of Operation)

FIGS. 8A, 8B, 80, 8D, 8E, and 8F illustrate an operation example of the time measurement apparatus 1, where FIG. 8A indicates a waveform of the output light L1 emitted from the light source 11, FIG. 8B indicates an operation of pixels 30(1) in the first column from the left in the pixel array 21, FIG. 8C indicates an operation of pixels 30(2) in the second column from the left in the pixel array 21, FIG. 8D indicates an operation of pixels 30(3) in the third column from the left in the pixel array 21, FIG. 8E indicates an operation of pixels 30(N) in the rightmost column (an Nth column) in the pixel array 21, and FIG. 8F indicates a waveform of the control signal EN_CAL. In FIGS. 8B, 8C, 8D, and 8E, a shaded portion indicates that the pixels 30 are selected, and a portion that is not shaded indicates that the pixels 30 are not selected.

In a measurement period T1, the time measurement apparatus 1 outputs light and detects reflected light reflected by the measurement target object 9 to generate a depth image. In addition, the time measurement apparatus 1 performs calibration processing for adjusting the delay times of the variable delay circuits 50 included in the pixels 30 in a period (a blanking period T2) between two measurement periods T1 adjacent to each other. This operation is described in detail below.

At a timing t1, upon start of the measurement period T1, first, the delay controller 28B turns the control signal EN_CAL to a low level (FIG. 8F). In a period from the timing t1 to a timing t2, the selection signal generator 22 then selects the pixels 30(1) in the first column (FIG. 8B). In addition, the light-emission timing setter 28A generates the light-emission trigger signal TRG. The light source driver 12 controls the operation of the light source 11 on the basis of the light-emission trigger signal TRG to cause the light source 11 to emit a light pulse a plurality of times in a predetermined light-emission cycle (a light-emission cycle T) in this period from the timing t1 to the timing t2 (FIG. 8A). This causes each of the pixels 30(1) to output the pulse signal SP including the received-light pulse PL corresponding to the incident reflected light L2. The pixel array 21 outputs this pulse signal SP as the signal S1.

The synchronizer 24 samples each of a plurality of signals S1 with the clock signal CK in this period from the timing t1 to the timing t2 to generate each of a plurality of signals S2. The adder 25 performs addition processing on the basis of the plurality of signals S2 to generate a plurality of signals S3. The histogram generator 26 performs histogram generation processing on the basis of the plurality of signals S3. Thus, a histogram related to the pixels 30(1) in the first column is generated.

Next, in a period from the timing t2 to a timing t3, the selection signal generator 22 selects the pixels 30(2) in the second column (FIG. 8C). The light source driver 12 then controls the operation of the light source 11 on the basis of the light-emission trigger signal TRG to cause the light source 11 to emit a light pulse a plurality of times in the light-emission cycle T in this period from the timing t2 to the timing t3 (FIG. 8A). This causes each of the pixels 30(2) to output the pulse signal SP including the received-light pulse PL corresponding to the incident reflected light L2. The pixel array 21 outputs this pulse signal SP as the signal S1.

The synchronizer 24 samples each of a plurality of signals S1 with the clock signal CK in this period from the timing t2 to the timing t3 to generate each of a plurality of signals S2. The adder 25 performs addition processing on the basis of the plurality of signals S2 to generate a plurality of signals S3. The histogram generator 26 performs histogram generation processing on the basis of the plurality of signals S3. Thus, a histogram related to the pixels 30(2) in the second column is generated.

The time measurement apparatus 1 selects the plurality of pixels 30 in the pixel array 21 sequentially on a column-by-column basis in a period from the timing t1 to a timing t4 (the measurement period T1) in such a manner. Thus, respective histograms related to the pixels in respective columns are generated.

The processor 27 then generates a depth image on the basis of the histograms generated in this period from the timing t1 to the timing t4 (the measurement period T1).

At the timing t4, upon start of the blanking period T2, the delay controller 28B of the controller 28 sets the control signal EN_CAL to the high level (active) (FIG. 8E). In a period from the timing t4 to a timing t5, the selection signal generator 22 then selects the pixels 30(1) in the first column ((B) of FIG. 8B). This causes the ring oscillators 44 of the pixels 30(1) to perform an oscillation operation, and each of the pixels 30(1) outputs the oscillation signal SO having a frequency corresponding to the delay time in the variable delay circuit 50. The pixel array 21 outputs this oscillation signal SO as the signal S1.

The synchronizer 24 samples each of a plurality of signals S1 with the clock signal CK in this period from the timing t4 to the timing t5 to generate each of a plurality of signals S2. The adder 25 performs addition processing on the basis of the plurality of signals S2 to generate a plurality of signals S3. The histogram generator 26 performs histogram generation processing on the basis of the plurality of signals S3. Thus, a histogram related to the pixels 30(1) in the first column is generated.

The delay controller 28B then sets the control signal EN_CAL to a low level (inactive) at a timing before the timing t5 (FIG. 8E).

Next, in a period from the timing t5 to a timing t6, the selection signal generator 22 selects the pixels 30(2) in the second column (FIG. 8C). This causes the ring oscillators 44 of the pixels 30(2) to perform an oscillation operation, and each of the pixels 30(2) outputs the oscillation signal SO having a frequency corresponding to the delay time in the variable delay circuit 50. The pixel array 21 outputs this oscillation signal SO as the signal S1.

The synchronizer 24 samples each of a plurality of signals S1 with the clock signal CK in this period from the timing t5 to the timing t6 to generate each of a plurality of signals S2. The adder 25 performs addition processing on the basis of the plurality of signals S2 to generate a plurality of signals S3. The histogram generator 26 performs histogram generation processing on the basis of the plurality of signals S3. Thus, a histogram related to the pixels 30(2) in the second column is generated.

The delay controller 28B then sets the control signal EN_CAL to the low level (inactive) at a timing before the timing t6 (FIG. 8E).

The time measurement apparatus 1 selects the plurality of pixels 30 in the pixel array 21 sequentially on a column-by-column basis in a period from the timing t4 to a timing t7 (the blanking period T2) in such a manner. Thus, respective histograms related to the pixels in respective columns are generated.

The delay time measurement section 27A of the processor 27 then measures the delay times of the variable delay circuits 50 on the basis of information about histograms supplied from the histogram generator 26. The delay controller 28B of the controller 28 determines setting of the delay time of each of the variable delay circuits 50 of the plurality of pixels 30 in the pixel array 21 in each of the areas AR on the basis of information supplied from the delay time measurement section 27A. The delay controller 28B then generates the control signal DSET on the basis of a determination result. This causes the delay time of each of the plurality of variable delay circuits 50 to be set to a time having a predetermined length.

At the timing t7, the next measurement period T1 then starts.

In this example, the calibration processing is performed in the blanking period T2; however, the calibration processing may not be performed in all blanking periods T2. For example, it is possible to perform the calibration processing once every predetermined number of blanking periods T2, for example.

(About Time Measurement Processing)

FIG. 9 schematically illustrates an operation of the selected pixel 30 in the measurement period T1. In the measurement period T1, the control signal EN_CAL is in the low level; therefore, the selector 47 outputs the signal at the first input terminal. In a case where the light receiving element 31 detects the reflected light L2, a voltage at the cathode of the light receiving element 31 is changed to the low level in a period having a predetermined length. In response to this, an output voltage of the inverter IV is changed to the high level in a period having a predetermined length. Thus, in the pixel 30, the received-light pulse PL is generated. The pulse signal SP including the received-light pulse PL is then outputted through the level conversion circuit BUF1, the selector 47, the logical AND circuit 48, and the logical OR circuit 49.

FIGS. 10A, 10B, 10C, 10D, and 10E illustrate the operation of the selected pixel 30 in the measurement period T1, where FIG. 10A indicates a waveform of a voltage (a cathode voltage) at the cathode of the light receiving element 31, FIG. 10B indicates a waveform of the output voltage of the inverter IV, FIG. 10C indicates a waveform of an output voltage of the logical OR circuit 43, FIG. 10D indicates a waveform of an output voltage of the variable delay circuit 50, and FIG. 10E indicates a waveform of an output voltage of the logical OR circuit 46.

In a case where the light receiving element 31 detects the reflected light L2, the cathode voltage of the light receiving element 31 is decreased from the voltage Ve at a timing t11 (FIG. 10A). The inverter IV changes the output voltage from the low level to the high level in accordance with this change of the cathode voltage at a timing t12 (FIG. 10B). This turns off the transistor 42.

The logical OR circuit 43 then changes the output voltage from the low level to the high level in accordance with this change of the output voltage of the inverter IV at a timing t13 (FIG. 10C). That is, in this measurement period T1, the control signal EN_CAL is in the low level, which causes the logical OR circuit 43 to change the output voltage from the low level to the high level in accordance with the change of the output voltage of the inverter IV.

The inverted logical AND circuit 45 then changes the output voltage from the high level to the low level in accordance with this change of the output voltage of the logical OR circuit 43, and at a timing t14, the variable delay circuit 50 changes the output voltage from the high level to the low level in accordance with this change of the output voltage of the inverted logical AND circuit 45 (FIG. 10D). That is, at the timing t13, the output voltage of the variable delay circuit 50 is in the high level; therefore, the inverted logical AND circuit 45 changes the output voltage from the high level to the low level in accordance with the change of the output voltage of the logical OR circuit 43. The variable delay circuit 50 then changes the output voltage from the high level to the low level in accordance with this change of the output voltage of the inverted logical AND circuit 45 at a timing delayed by a delay time corresponding to the control signal DSET. A time between the timing t13 and the timing t14 is a total time (a delay time td) of a delay time of the inverted logical AND circuit 45 and the delay time of the variable delay circuit 50. The delay time of the variable delay circuit 50 is sufficiently longer than the delay time of the inverted logical AND circuit 45; therefore, the delay time td is substantially the same as the delay time of the variable delay circuit 50.

The logical OR circuit 46 then changes the output voltage from the high level to the low level in accordance with this change of the output voltage of the variable delay circuit 50 at a timing t15 (FIG. 10E). That is, in the measurement period T1, the control signal EN_CAL is in the low level; therefore, the logical OR circuit 46 changes the output voltage from the high level to the low level in accordance with the change of the output voltage of the variable delay circuit 50.

The transistor 41 is turned on in accordance with this change of the output voltage of the logical OR circuit 46, and at a timing t16, the cathode voltage of the light receiving element 31 is increased to be the voltage Ve (FIG. 10A). The inverter IV changes the output voltage from the high level to the low level in accordance with this change of the cathode voltage at a timing t17 (FIG. 10B). This turns on the transistor 42.

The logical OR circuit 43 then changes the output voltage from the high level to the low level in accordance with this change of the output voltage of the inverter IV at a timing t18 (FIG. 10C).

In addition, in accordance with the change of the output voltage of the variable delay circuit 50 at the timing t14, the inverted logical AND circuit 45 changes the output voltage from the low level to the high level, and at a timing t19, the variable delay circuit 50 changes the output voltage from the low level to the high level in accordance with this change of the output voltage of the inverted logical AND circuit 45 (FIG. 10D).

The logical OR circuit 46 then changes the output voltage from the low level to the high level in accordance with this change of the output voltage of the variable delay circuit 50 at a timing t20 (FIG. 10E). This turns off the transistor 41.

Thus, in the selected pixel 30, as illustrated in FIG. 10B, the received-light pulse PL is generated every time the light receiving element 31 receives the reflected light L2. The pulse width of the received-light pulse PL is controlled by the delay time td. In other words, the pulse width of the received-light pulse PL is controlled by the delay time of the variable delay circuit 50. In the selected pixel 30, the received-light pulse PL having a pulse width corresponding to the delay time of the variable circuit 50 is generated every time the light receiving element 31 receives the reflected light L2 in such a manner. This pixel 30 then outputs the pulse signal SP including this received-light pulse PL.

Next, the operation of the time measurement device 20 in the measurement period T1 is described with use of an operation related to a certain pixel 30 of the pixels 30 in the one selected column as an example.

FIGS. 11A, 11B, 11C, and 11D illustrate an operation example of the time measurement device 20 in the measurement period T1, where FIG. 11A indicates a waveform of the signal SIN, FIG. 11B indicates a waveform of the signal S1, FIG. 11C indicates a waveform of the signal S2, and FIG. 11D indicates a waveform of the signal S3. In FIGS. 11C and 11D, the waveforms are illustrated using a clock cycle TCK.

The signal generator 23 changes the voltage of the signal SIN from the low level to the high level at a timing t21, and changes the voltage of the signal SIN from the high level to the low level at a timing t22 (FIG. 11A). This reference pulse PR is generated at a timing corresponding to a timing at which the light source 11 emits light. This reference pulse PR is transmitted through the daisy-chain coupled pixels 30 in one row in the pixel array 21.

The pixel array 21 then changes the voltage of the signal S1 from the low level to the high level at a timing t23, and changes the voltage of the signal S1 from the high level to the low level at a timing t24 ((B) of FIG. 11B). The pixel array 21 outputs the reference pulse PR supplied from the signal generator 23 in such a manner.

Then, in a case where the pixel 30 detects the reflected light L2 at a certain timing, the pixel array 21 changes the voltage of the signal S1 from the low level to the high level at a timing t25 after the certain timing, and changes the voltage of the signal S1 from the high level to the low level at a timing t26 ((B) of FIG. 11B). The pixel array 21 outputs a first received-light pulse PL (a received-light pulse PL1) in such a manner.

Then, in a case where the pixel 30 detects the reflected light L2 at another certain timing, the pixel array 21 changes the voltage of the signal S1 from the low level to the high level at a timing t27 after the other certain timing, and changes the voltage of the signal S1 from the high level to the low level at a timing t28 FIG. 11B)). The pixel array 21 outputs a second received-light pulse PL (a received-light pulse PL2) in such a manner.

The flip-flop 64 of the synchronizer 24 samples this signal S1 with the clock signal CK to generate the signal S2 (FIG. 11C). The addition circuit 65 of the adder 25 performs addition processing on the basis of a plurality of signals S2 outputted from a plurality of flip-flops 64 to generate the signal S3 (FIG. 11D). The histogram generation circuit 66 of the histogram generator 26 performs histogram generation processing on the basis of the signal S3 to generate a histogram.

The processor 27 then measures a time difference Δt between a timing at which the light source 11 emits light and a timing at which the light receiving element 31 of the time measurement device 20 detects light on the basis of this signal S3. Specifically, the processor 27 measures a time difference Δt1 on the basis of a histogram related to the reference pulse PR and a histogram related to the received-light pulse PL1, and measures a time difference Δt2 on the basis of the histogram related to the reference pulse PR and a histogram related to the received-light pulse PL2. The processor 27 may measure the time difference At using peak timings in the histograms, or may measure the time difference At using edge timings in the histograms.

The processor 27 then generates the depth image PIC on the basis of these time differences Δt.

(About Calibration Processing)

FIG. 12 schematically illustrates an operation of the selected pixel 30 in the calibration mode. In a period in which the control signal EN_CAL is in the high level, the selector 47 outputs the signal at the second input terminal. In addition, in the period in which the control signal EN_CAL is in the high level, the logical OR circuit 43 outputs the high level; therefore, the ring oscillator 44 performs an oscillation operation. This causes the ring oscillator 44 to generate the oscillation signal SO having a frequency corresponding to the delay time in the variable delay circuit 50. This oscillation signal SO is outputted through the level conversion circuit BUF2, the selector 47, the logical AND circuit 48, and the logical OR circuit 49.

Next, the operation of the time measurement device 20 in the calibration mode is described with use of an operation related to a certain pixel 30 of the pixels 30 in one selected column as an example.

FIGS. 13A, 13B, 13C, and 13D illustrate an operation example of the time measurement device 20 in the calibration mode, where FIG. 13A indicates the waveform of the control signal EN_CAL, FIG. 13B indicates the waveform of the signal S1, FIG. 13C indicates the waveform of the signal S2, and FIG. 13D indicates the waveform of the signal S3. In (G) and (D) of FIGS. 13C and 13D, the waveforms are illustrated using the clock cycle TCK.

The delay controller 28B of the controller 28 changes the voltage of the control signal EN_CAL from the low level to the high level at a timing t31 FIG. 13A). Accordingly, in the pixel 30, the ring oscillator 44 performs the oscillation operation, and generates the oscillation signal SO having a frequency corresponding to the delay time in the variable delay circuit 50.

The pixel array 21 then outputs the oscillation signal SO as the signal S1 at a timing t32 (FIG. 13B).

The flip-flop 64 of the synchronizer 24 samples this signal S1 with the clock signal CK to generate the signal S2 (FIG. 13C). The addition circuit 65 of the adder 25 performs addition processing on the basis of a plurality of signals S2 outputted from a plurality of flip-flops 64 to generate the signal S3 ((D) of FIG. 13D). The histogram generation circuit 66 of the histogram generator 26 performs histogram generation processing on the basis of the signal S3 to generate a histogram.

The delay time measurement section 27A of the processor 27 then measures the delay time of the variable delay circuit 50 on the basis of this signal S3. Specifically, the delay time measurement section 27A measures a time length tH of a period in which the oscillation signal SO is in the high level. The delay time measurement section 27A is able to measure the time length tH with use of edge timings of both edges in the histogram, for example. This time length tH corresponds to a total time (the delay time td illustrated in FIGS. 10A, 10B, 10C, 10D, and 10E) of the delay time of the inverted logical AND circuit 45 and the delay time of the variable delay circuit 50 in the ring oscillator 44. The delay time of the variable delay circuit 50 is sufficiently longer than the delay time of the inverted logical AND circuit 45; therefore, the measured time length tH is substantially the same as the delay time of the variable delay circuit 50. The delay time measurement section 27A measures the delay time of the variable delay circuit 50 in such a manner.

The delay time measurement section 27A supplies information about the measured delay time to the controller 28. The delay controller 28B of the controller 28 determines setting of the delay time of the variable delay circuit 50 of each of the plurality of pixels 30 in the pixel array 21 in each of the areas AR on the basis of information supplied from the delay time measurement section 27A. The delay controller 28B then generates the control signal DSET on the basis of a determination result. This causes the delay time of each of the plurality of variable delay circuits 50 to be set to a time having a predetermined length.

In such a manner, in the time measurement device 20, each of the pixels 30 includes the transistor 41, and the light receiving element 31 receives the reflected light L2, thereby turning on the transistor 41 at a timing after a lapse of a predetermined time from when the cathode voltage of the light receiving element 31 is decreased. This makes it possible to shorten a dead time in the time measurement device 20, as compared with a configuration in which the light receiving element 31 and a resistor 41R are coupled in series to each other without providing the transistor 41, for example, as illustrated in FIG. 14.

In addition, in the time measurement device 20, each of the pixels 30 includes the variable delay circuit 50, and the pulse signal SP including the received-light pulse PL having a pulse width corresponding to the delay time of the variable delay circuit 50 is generated. Then, in the time measurement device 20, in the calibration mode, the delay time of the variable delay circuit 50 is measured, and the delay time of the variable delay circuit 50 is set to a time having a predetermined length on the basis of a result of such measurement. This makes it possible to shorten the dead time in the time measurement device 20. That is, for example, as illustrated in FIG. 15, in a case where a ring oscillator 44R is configured using a delay circuit 50R instead of the variable delay circuit 50, a delay time of the delay circuit 50R is changed due to process variations, variations in power source voltage, temperature variations, and the like. In this case, the length of the dead time is also changed, which may increase the dead time. In contrast, in the time measurement device 20, the delay time of the variable delay circuit 50 is set to a time having a predetermined length, which makes it possible to suppress change in the length of the dead time and shorten the dead time.

In addition, in the time measurement device 20, in the calibration mode, the ring oscillator 44 is configured using the variable delay circuit 50, and the delay time of the variable delay circuit 50 is measured on the basis of the oscillation signal SO of the ring oscillator 44. This makes it possible to measure the delay time of the variable delay circuit 50 on the basis of a time of a half cycle of the oscillation signal SO, thereby making it possible to measure the delay time of the variable delay circuit 50 by a simple method.

In addition, in the time measurement device 20, the calibration processing is performed using the synchronizer 24, the adder 25, and the histogram generator 26 that are used for time measurement processing. This makes it possible to reduce the number of circuits added for performing the calibration processing, thereby making it possible to simplify a circuit configuration.

Effects

As described above, in the present embodiment, each of the pixels includes the transistor 41, and the light receiving element receives reflected light, thereby turning on this transistor at a timing after a lapse of a predetermined time from when the cathode voltage of the light receiving element is decreased, which makes it possible to shorten a dead time.

In the present embodiment, each of the pixels includes the variable delay circuit, and generates a pulse signal that includes a received-light pulse having a pulse width corresponding to the delay time of the variable delay circuit. In the calibration mode, the delay time of the variable delay circuit is then measured, and the delay time of the variable delay circuit is set to a time having a predetermined length on the basis of a result of such measurement. This makes it possible to shorten the dead time.

In the present embodiment, in the calibration mode, the ring oscillator is configured using the variable delay circuit, and the delay time of the variable delay circuit is measured on the basis of the oscillation signal of this ring oscillator, which makes it possible to measure the delay time of the variable delay circuit by a simple method.

In the present embodiment, the calibration processing is performed using the synchronizer, the adder, and the histogram generator that are used for time measurement processing, which makes it possible to simplify a circuit configuration. [Modification Example 1]

In the above-described embodiment, as illustrated in FIG. 16, the cathode of the light receiving element 31 is coupled to the pixel circuit 40, but the embodiment is not limited thereto. Alternatively, for example, as illustrated in FIG. 17, an anode of a light receiving element may be coupled to a pixel circuit. A pixel according to the present modification example includes a light receiving element 31A and a pixel circuit 40A. The light receiving element 31A has an anode coupled to the pixel circuit 40A, and a cathode supplied with a voltage V1. The pixel circuit 40A includes transistors 41A and 42A and the inverter IV. The transistors 41A and 41B are N-type MOS transistors. The transistor 41A has a drain coupled to the anode of the light receiving element 31A, a drain of the transistor 42A, and the input terminal of the inverter IV, and a source supplied with a voltage V2. The transistor 42A has the drain coupled to the anode of the light receiving element 31A, the drain of the transistor 41A, and the input terminal of the inverter IV, a gate coupled to the output terminal of the inverter IV, and a source supplied with the voltage V2. [Modification Example 2]

In the above-described embodiment, as illustrated in FIG. 6, the pixel array 21 is partitioned into 32 (=4×8) areas AR, and the delay times of the variable delay circuits 50 are adjusted in units of areas AR. That is, in this example, the pixel array 21 is partitioned in the transverse direction and the longitudinal direction, but the embodiment is not limited thereto. For example, as illustrated in FIG. 18, the pixel array 21 may be partitioned only in the longitudinal direction. In this example, the pixel array 21 is partitioned into eight. In addition, for example, as illustrated in FIG. 19, the pixel array 21 may not be partitioned. In this case, it is possible to make delay settings in all the variable delay circuits 50 in the pixel array 21 the same as each other.

2. Application Example

In the above-described embodiment, the present technology is applied to the time measurement apparatus having a configuration illustrated in FIG. 1; however, the present technology is not limited thereto. For example, the time measurement apparatus may be applied to a time measurement apparatus having a configuration illustrated in FIG. 20. This time measurement apparatus 2 includes a lens 71, a pixel array 72, a lens 73, a pixel array 74, and a time measurement section 75.

The lens 71 is configured to diffuse light emitted from the light source 11 within a predetermined angle range. In addition, the lens 71 reflects a portion of the light emitted from the light source 11 toward the pixel array 72.

The pixel array 72 is configured to detect the light reflected by the lens 71 as reference light. The pixel array 72 has a configuration similar to that of the pixel array 21 according to the above-described embodiment, for example.

The lens 73 is configured to form an image on the light reception surface S of the pixel array 74. Light (the reflected light L2) reflected by the measurement target object 9 enters the lens 73.

The pixel array 74 is configured to detect the reflected light L2. This pixel array 74 has a configuration similar to that of the pixel array 21 according to the above-described embodiment.

The time measurement section 75 is configured to generate the depth image PIC by measuring a time difference between a timing at which light is outputted and a timing at which reflected light is detected on the basis of the signals S1 supplied from the pixel arrays 72 and 74.

3. Practical Application Example to Mobile Body

The technology (the present technology) according to the present disclosure is applicable to various products. For example, the technology according to the present disclosure may be achieved as an apparatus mounted on any type of mobile body such as a vehicle, an electric vehicle, a hybrid electric vehicle, a motorcycle, a bicycle, a personal mobility, an airplane, a drone, a vessel, or a robot.

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure may be applied has been described above. The technology according to the present disclosure may be applied to the imaging section 12031 among the components described above. This makes it possible to shorten a dead time in the vehicle control system 12000, which makes it possible to enhance measurement accuracy. This consequently allows the vehicle control system 12000 to enhance accuracy of a collision avoidance or collision mitigation function for vehicles, a following driving function based on a following distance, a vehicle speed maintaining driving function, a function of warning of collision of the vehicle, a function of warning of deviation of the vehicle from a lane, and the like.

Although the present technology has been described with reference to some embodiments, modification examples, and specific practical application examples thereof, the present technology is not limited to the embodiments and the like, and may be modified in a variety of ways.

For example, the pixels 30 are not limited to the configuration illustrated in FIG. 4, and may use any of various configurations in which the pulse width of the received-light pulse PL is settable with use of the variable delay circuit 50.

It is to be noted that the effects described in this specification are merely illustrative and non-limiting, and other effects may be provided.

It is to be noted that the present technology may have the following configurations.

(1)

A time measurement device including:

a pixel that includes a light receiving element and a delay circuit having a variable delay time, is configured to output, as an output signal, a pulse signal that includes a received-light pulse having a pulse width corresponding to the delay time in a first operation mode, and is configured to have a ring oscillator with use of the delay circuit and configured to output, as the output signal, an oscillation signal in the ring oscillator in a second operation mode; and a time measurement section that is configured to perform time measurement processing on the basis of the output signal.

(2)

The time measurement device according to (1), in which the time measurement processing includes measuring the delay time of the delay circuit on the basis of the oscillation signal in the second operation mode.

(3)

The time measurement device according to (2), in which the oscillation signal makes a transition between a first logical level and a second logical level, and the time measurement processing includes measuring the delay time of the delay circuit by measuring a length of a time in which the first logical level continues.

(4)

The time measurement device according to (2) or (3), further including a delay controller that is configured to adjust the delay time of the delay circuit on the basis of the delay time measured by the time measurement section.

(5)

The time measurement device according to (4), in which a plurality of the pixels is provided, the delay times of the delay circuits in the plurality of the pixels are set on the basis of a single delay setting, the time measurement processing includes measuring the delay times of the delay circuits in the plurality of the pixels on the basis of a plurality of the oscillation signals outputted from the respective plurality of the pixels in the second operation mode, and the delay controller is configured to generate the delay setting on the basis of the delay time measured by the time measurement section.

(6)

The time measurement device according to any one of (1) to (5), in which the time measurement processing includes detecting a light-reception timing of the light receiving element on the basis of the pulse signal in the first operation mode.

(7)

The time measurement device according to any one of (1) to (6), in which the pixel includes a switch that is configured to couple a light-reception node and a first power source node to each other by being turned on, the light receiving element is inserted between the light-reception node and a second power source node, the delay circuit delays a signal corresponding to a voltage of the light-reception node in the first operation mode, and the switch is configured to be turned on, on the basis of a signal delayed by the delay circuit in the first operation mode.

(8)

The time measurement device according to (7), in which the pixel further includes a selector, the pulse signal includes a signal corresponding to the voltage of the light-reception node, and the selector is configured to select the pulse signal as the output signal in the first operation mode, and is configured to select the oscillation signal as the output signal in the second operation mode.

(9)

The time measurement device according to (7) or (8), in which the light receiving element is formed on a first semiconductor substrate, and the delay circuit and the switch are formed on a second semiconductor substrate superimposed on the first semiconductor substrate.

(10)

The time measurement device according to any one of (1) to (9), in which the light receiving element includes a single-photon avalanche diode.

(11)

A time measurement apparatus including:

a light source that is configured to emit light;

a pixel that includes a light receiving element and a delay circuit having a variable delay time, the light receiving element being configured to detect reflected light corresponding to the light, the pixel that is configured to output, as an output signal, a pulse signal that includes a received-light pulse having a pulse width corresponding to the delay time in a first operation mode, and is configured to have a ring oscillator with use of the delay circuit and configured to output, as the output signal, an oscillation signal in the ring oscillator in a second operation mode; and a time measurement section that is configured to perform time measurement processing on the basis of the output signal.

This application claims the benefit of Japanese Priority Patent Application JP2018-148675 filed with the Japan Patent Office on Aug. 7, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A time measurement device, comprising:

a pixel that includes a light receiving element and a delay circuit having a variable delay time, is configured to output, as an output signal, a pulse signal that includes a received-light pulse having a pulse width corresponding to the variable delay time in a first operation mode, and is configured to have a ring oscillator with use of the delay circuit and configured to output, as the output signal, an oscillation signal in the ring oscillator in a second operation mode; and a time measurement section that is configured to perform time measurement processing on a basis of the output signal.

2. The time measurement device according to claim 1, wherein the time measurement processing includes measuring the variable delay time of the delay circuit on a basis of the oscillation signal in the second operation mode.

3. The time measurement device according to claim 2, wherein the oscillation signal makes a transition between a first logical level and a second logical level, and the time measurement processing includes measuring the variable delay time of the delay circuit by measuring a length of a time in which the first logical level continues.

4. The time measurement device according to claim 2, further comprising a delay controller that is configured to adjust the variable delay time of the delay circuit on a basis of the variable delay time measured by the time measurement section.

5. The time measurement device according to claim 4, wherein a plurality of the pixels is provided, the variable delay times of the delay circuits in the plurality of the pixels are set on a basis of a single delay setting, the time measurement processing includes measuring the variable delay times of the delay circuits in the plurality of the pixels on a basis of a plurality of the oscillation signals outputted from respective plurality of the pixels in the second operation mode, and the delay controller is configured to generate the single delay setting on the basis of the variable delay time measured by the time measurement section.

6. The time measurement device according to claim 1, wherein the time measurement processing includes detecting a light-reception timing of the light receiving element on a basis of the pulse signal in the first operation mode.

7. The time measurement device according to claim 1, wherein the pixel includes a switch that is configured to couple a light-reception node and a first power source node to each other by being turned on, the light receiving element is inserted between the light-reception node and a second power source node, the delay circuit delays a signal corresponding to a voltage of the light-reception node in the first operation mode, and the switch is configured to be turned on, on a basis of a signal delayed by the delay circuit in the first operation mode.

8. The time measurement device according to claim 7, wherein the pixel further includes a selector, the pulse signal includes a signal corresponding to the voltage of the light-reception node, and the selector is configured to select the pulse signal as the output signal in the first operation mode, and is configured to select the oscillation signal as the output signal in the second operation mode.

9. The time measurement device according to claim 7, wherein the light receiving element is formed on a first semiconductor substrate, and the delay circuit and the switch are formed on a second semiconductor substrate superimposed on the first semiconductor substrate.

10. The time measurement device according to claim 1, wherein the light receiving element includes a single-photon avalanche diode.

11. A time measurement apparatus, comprising:

a light source that is configured to emit light;

a pixel that includes a light receiving element and a delay circuit having a variable delay time, the light receiving element being configured to detect reflected light corresponding to the light, the pixel that is configured to output, as an output signal, a pulse signal that includes a received-light pulse having a pulse width corresponding to the variable delay time in a first operation mode, and is configured to have a ring oscillator with use of the delay circuit and configured to output, as the output signal, an oscillation signal in the ring oscillator in a second operation mode; and a time measurement section that is configured to perform time measurement processing on a basis of the output signal.

* * * * *